(12) United States Patent
Crocco et al.

(10) Patent No.: US 10,926,357 B2
(45) Date of Patent: Feb. 23, 2021

(54) METHOD AND FUNCTIONAL ARCHITECTURE FOR INLINE REPAIR OF DEFECTIVE IMAGING ARRAYS

(71) Applicant: dpiX, LLC, Colorado Springs, CO (US)

(72) Inventors: Jerome David Crocco, Colorado Springs, CO (US); Kevin Cadena, Pueblo, CO (US); Michael Keith Forsyth, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 202 days.

(21) Appl. No.: 15/951,876

(22) Filed: Apr. 12, 2018

(65) Prior Publication Data

US 2018/0339367 A1 Nov. 29, 2018

Related U.S. Application Data

(60) Provisional application No. 62/484,775, filed on Apr. 12, 2017.

(51) Int. Cl.
*B23K 26/348* (2014.01)
*H01L 21/66* (2006.01)
*H04N 5/367* (2011.01)

(52) U.S. Cl.
CPC ............ *B23K 26/348* (2015.10); *H01L 22/14* (2013.01); *H01L 22/20* (2013.01); *H01L 22/24* (2013.01); *H04N 5/367* (2013.01)

(58) Field of Classification Search
CPC ............................. B23K 26/348; H04N 5/367
See application file for complete search history.

(56) References Cited

U.S. PATENT DOCUMENTS

| | | | |
|---|---|---|---|
| 5,731,803 A * | 3/1998 | Martin | G02F 1/134336 257/59 |
| 9,007,495 B1 * | 4/2015 | Chin | H04N 19/186 348/246 |
| 2001/0028418 A1 * | 10/2001 | Ozaki | G02F 1/136286 349/54 |
| 2002/0196354 A1 * | 12/2002 | Chang | H04N 5/2176 348/246 |
| 2008/0030877 A1 * | 2/2008 | Turk | H01L 21/02691 359/719 |
| 2014/0183675 A1 * | 7/2014 | Couture | H01L 27/14663 257/428 |
| 2016/0268541 A1 * | 9/2016 | Dabich, II | B23K 26/206 |
| 2016/0322002 A1 * | 11/2016 | Tseng | G02B 26/026 |
| 2017/0051883 A1 * | 2/2017 | Raring | H01S 5/32 |

* cited by examiner

*Primary Examiner* — Mohammad M Choudhry
(74) *Attorney, Agent, or Firm* — Slater Matsil, LLP

(57) ABSTRACT

A method for improving the performance of an image sensor array includes performing an electrical test on the image sensor array, generating a test image from the electrical test to detect an open circuit in a data line of the image sensor array, performing a laser-weld operation the data line to weld a portion of the data line to ground, re-testing the image sensor array to confirm a successful laser-weld operation, performing a laser-cut on a readout portion of the data line, and re-testing the image sensor array to confirm a successful laser-cut operation.

19 Claims, 26 Drawing Sheets

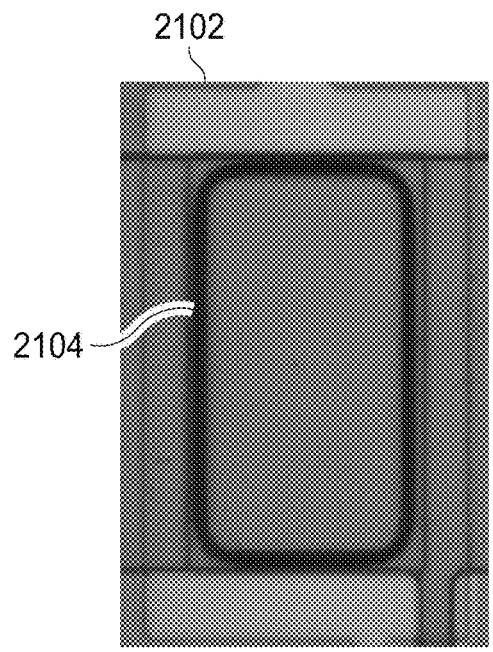 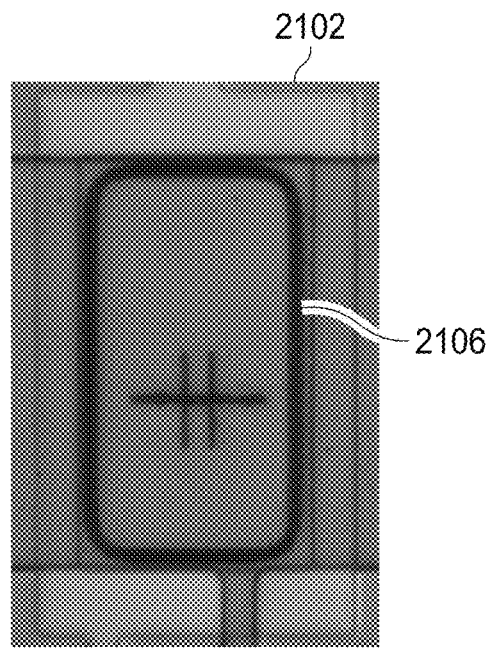
FIG. 21A    FIG. 21B
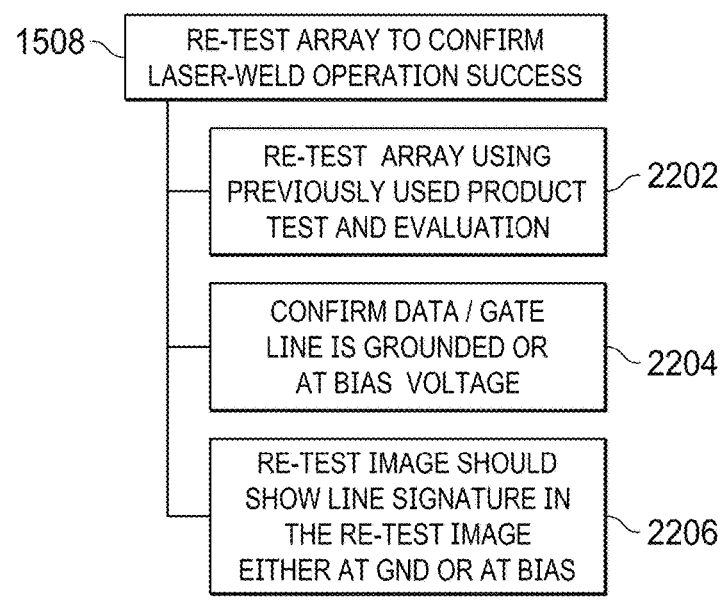
FIG. 22

| REF | # WELD PATTERNS | HORIZONTAL LINE WIDTH | HORIZONTAL LINE HEIGHT | VERTICAL LINE HEIGHT | VERTICAL LINE WIDTH | # SHOTS | WAVELENGTH | POWER | FREQ (Hz) |
|---|---|---|---|---|---|---|---|---|---|
| A | 3 | 100 | 5 | 20 | 5 | 80 | UV | 60% | 100 |
| B | 1 | 100 | 5 | 20 | 5 | 80 | UV | 70% | 70 |
| C | 1 | 100 | 5 | 100 | 5 | 80 | UV | 80% | 80 |
| D | 1 | 100 | 5 | 100 | 10 | 60 | UV | 85% | 60 |
| WINDOW | 1-N | 20-150 | 1-20 | 20-150 | 1-20 | 50-100 | UV | 50-90% | 50-120 |

EXAMPLE CONDITIONS

METHOD AND FUNCTIONAL ARCHITECTURE FOR INLINE REPAIR OF DEFECTIVE IMAGING ARRAYS

CROSS-REFERENCE TO RELATED APPLICATIONS

This application claims the benefit of U.S. Provisional Application No. 62/484,775, filed on Apr. 12, 2017, which application is hereby incorporated herein by reference.

TECHNICAL FIELD

The present invention relates generally to a method and functional architecture for inline repair of defective imaging arrays.

BACKGROUND

The manufacturing process of a sensor array is typically comprised of a series of cycles wherein (a) thin films of material are deposited onto a substrate, (b) a protective lithographic mask is applied to the deposited material, and (c) the remaining material not covered by the mask is subsequently removed or etched. This process of thin film deposition, lithographic coating, and etching, results in a thin film of material whose geometry is determined by the design of the lithographic mask. The use of various lithographic masks in conjunction with the wide range of electronic materials provides the capacity to form complex device architectures with characteristics suitable for various applications.

To access the information stored in each sensor pixel created in such a fashion, an array of parallel gate lines are typically used for switching on a line of pixels, one row at a time. When a gate line becomes energized, an orthogonal array of parallel data lines may be used to transfer the charge stored in the row of sensor pixels, to the feedback capacitor of the read out electronics. This cycle of energizing each gate line to read out each row of pixels using the orthogonal array of data-lines is a well-known algorithm for creating an image from an array of individually addressed pixels.

At this micro- and sub-microscopic level, objects such as particles, flakes, or dust begin to impact on the congruence between the physical dimensions of the desired features and its lithographic design. For example, particles may fall on the substrate during thin film deposition causing defects in the metal gate or data transmission lines. One consequence of this may be that the continuity of the gate or data line is interrupted and is effectively "open", so that the row or column of data is no longer connected to the read out electronics. Alternatively, particles may also block or absorb the lithographic masking layer causing the lithographic mask to spread out across the film, which may in turn cause electronic shorts between adjacent data lines, or between data transmission lines and pixel bias lines.

SUMMARY

A method for improving the performance of an image sensor array comprises performing at least one electrical test on the image sensor array; generating a test image from the at least one electrical test to detect an open circuit in a data line of the image sensor array; performing a laser-weld operation on at least one side of the data line to weld at least a portion of the data line to ground; re-testing the image sensor array to confirm a successful laser-weld operation; performing a laser-cut on a readout portion of the data line; and re-testing the image sensor array to confirm a successful laser-cut operation.

BRIEF DESCRIPTION OF THE DRAWINGS

For a more complete understanding of the present invention, and the advantages thereof, reference is now made to the following descriptions taken in conjunction with the accompanying drawings, in which:

FIGS. 20 and 21A-21B illustrate further details of the laser-welding operation step of the flow chart of FIG. 15;

FIGS. 22 and 23 illustrate further details of the confirm laser-weld success step of the flow chart of FIG. 15;

DETAILED DESCRIPTION OF ILLUSTRATIVE EMBODIMENTS

Due to the occurrence of defects in the thin film deposition, the lithographic masking layer or subsequent processing, a partial row or column of pixels may be inactive due to both electronic shorts and opens in the metal transmission lines of a sensor array i.e. the aforementioned gate, data or bias metal lines. Furthermore, these defects often cause severe degradation to the final image quality if not attended to i.e. excessive photodiode leakage onto the data transmission line. One common approach to remove the effect of the defective metal transmission lines is to simply cut the defective line (gate, data, or bias lines) so that all of the pixels in the row or column are equally unresponsive. However, the transmission line is now effectively at a floating voltage and can even act as an antenna, picking up environmental noise, which can also introduce unintentional artifacts to the sensory array.

Embodiment methods implement a functional architecture located around the periphery of a standard detector array, on either side of the transmission lines such that in the case of a defective transmission line, the floating voltage can effectively be "grounded" to avoid unintended artifacts from being introduced to the imaging array.

An embodiment method comprises (1) a laser tool at specific wavelengths and range of powers, (2) a functional metal-dielectric-metal architecture, (3) a preferred profile of the laser-welding beam, (4) a preferred geometry of the laser-welding cut, (5) a preferred minimum and maximum spacing between each laser cut, and (6) a preferred location for these features to be located on the sensor array.

As previously described, the manufacturing process for a sensor array is typically comprised of a series of cycles wherein thin films of material are deposited onto a substrate, a protective lithographic mask is applied to the deposited material, and the remaining material not covered by the mask is subsequently removed or etched.

Figure 35:
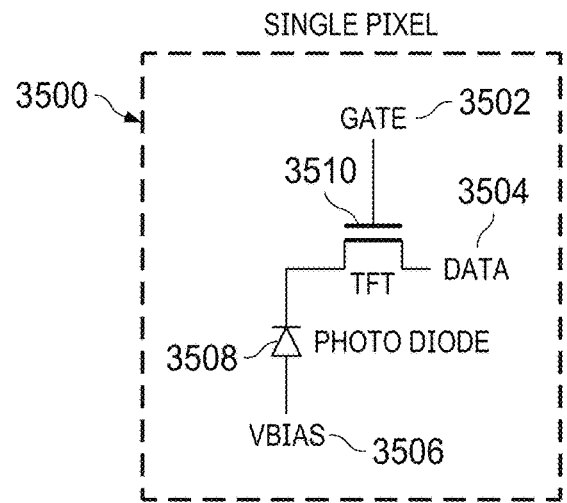
FIG. 35 is a schematic of a single pixel according to an embodiment.
Figure 36:
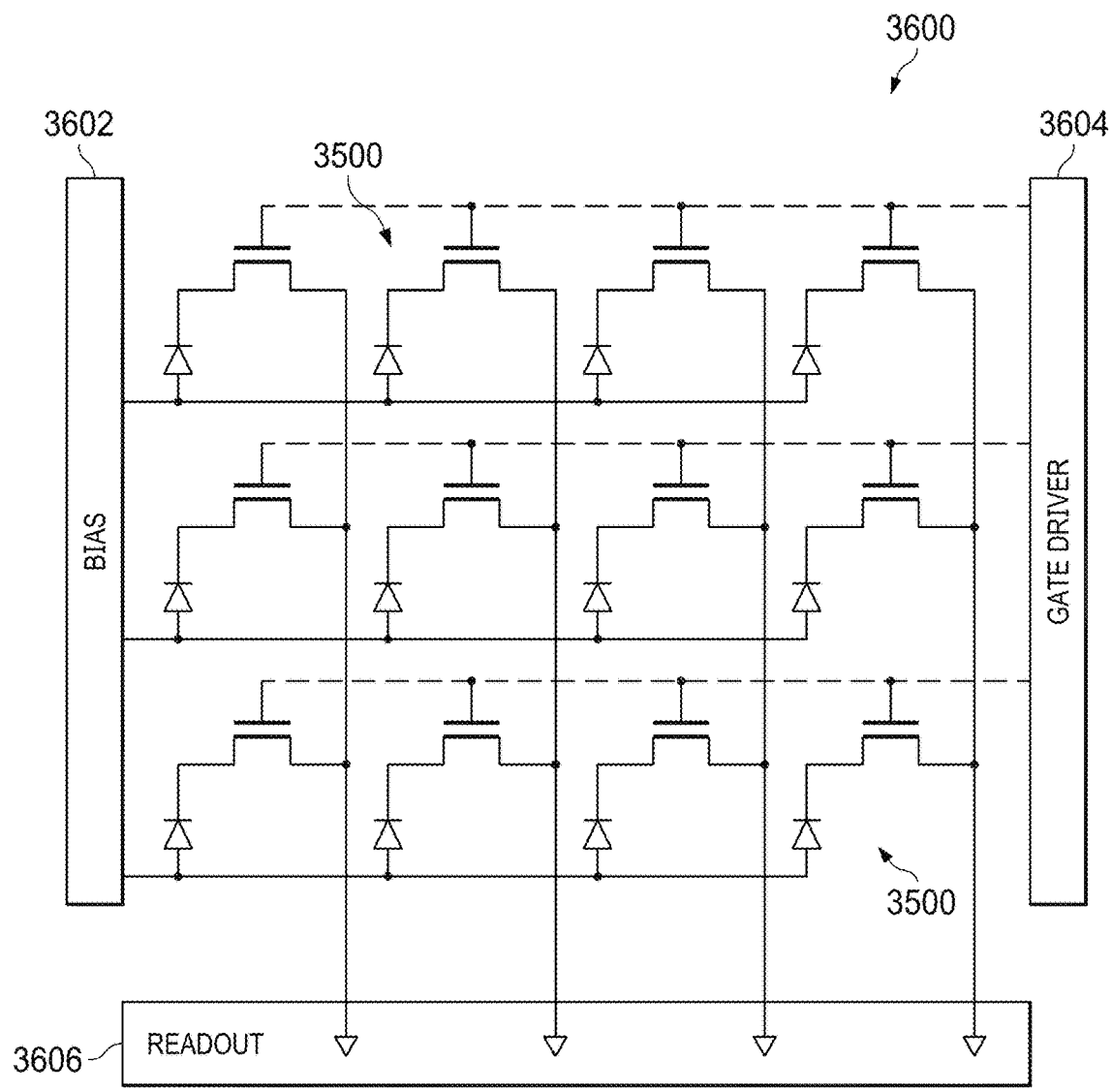
FIG. 36 is a schematic of an image sensor pixel array including a plurality of pixels of the type shown in FIG. 35.
Figure 37:
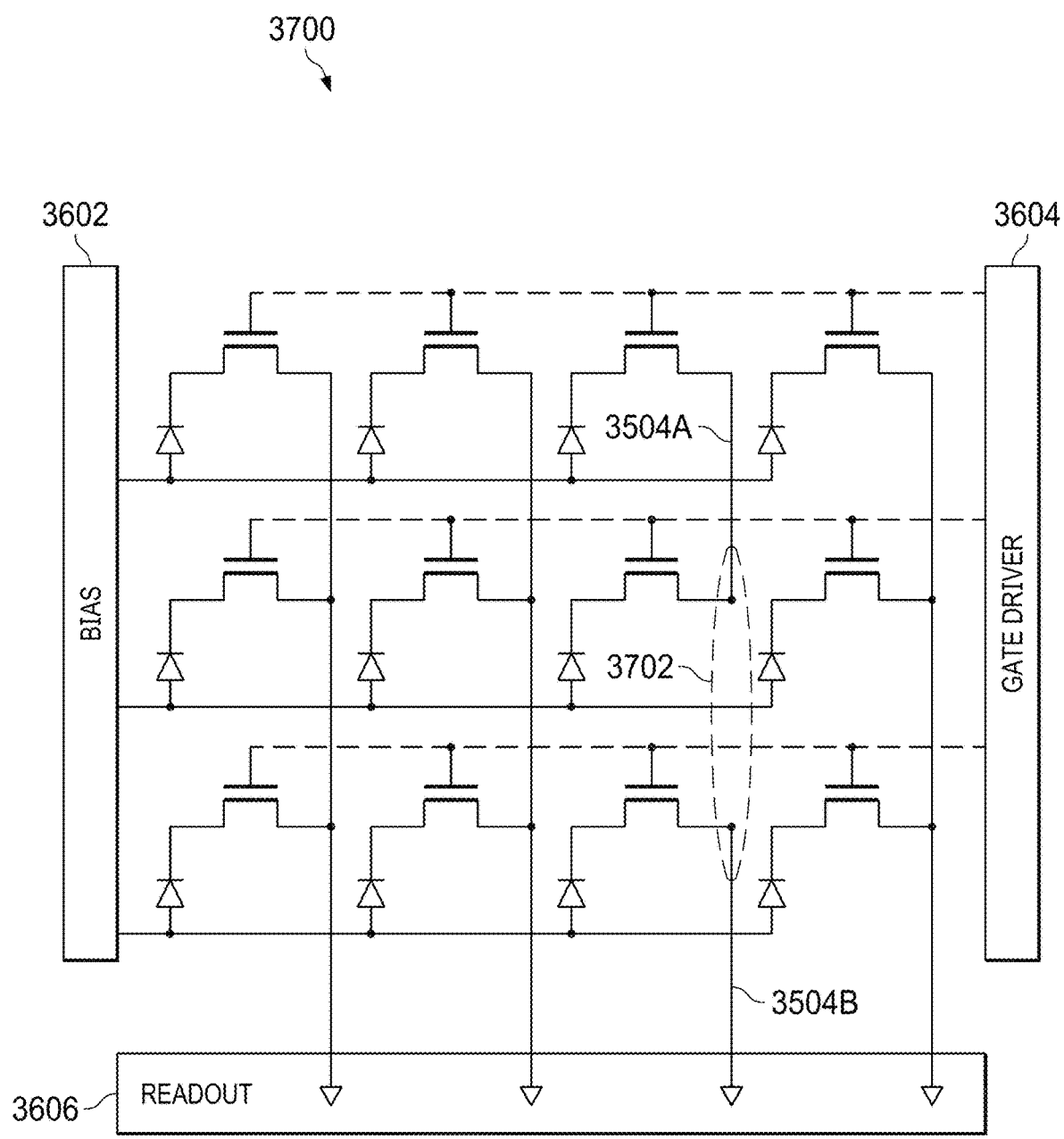
FIG. 37 is an image sensor pixel array as shown in FIG. 36, but including an open circuit in the data line.
Figure 38:
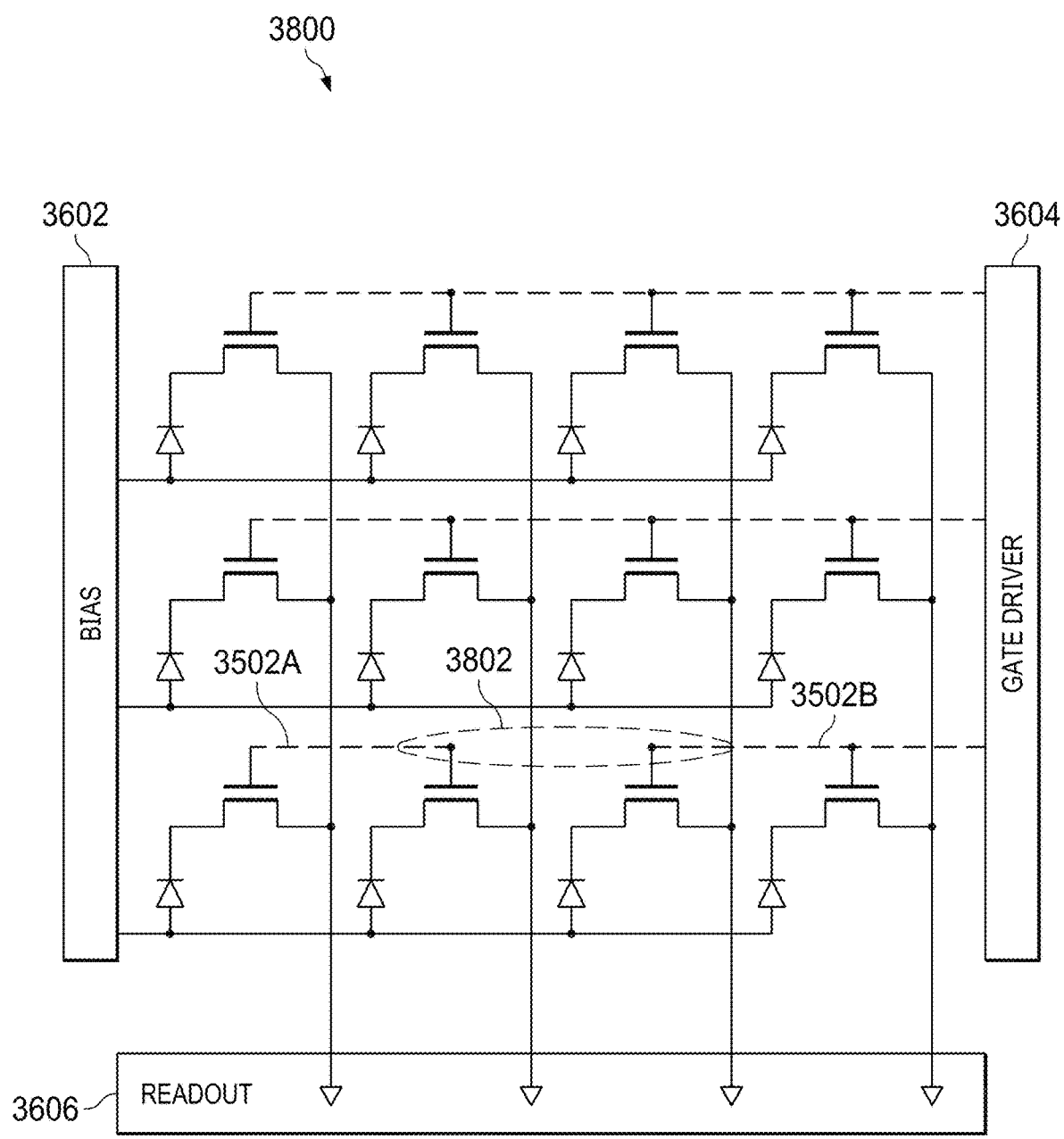
FIG. 38 is an image sensor pixel array as shown in FIG. 36, but including an open circuit in the gate line.
Figure 39:
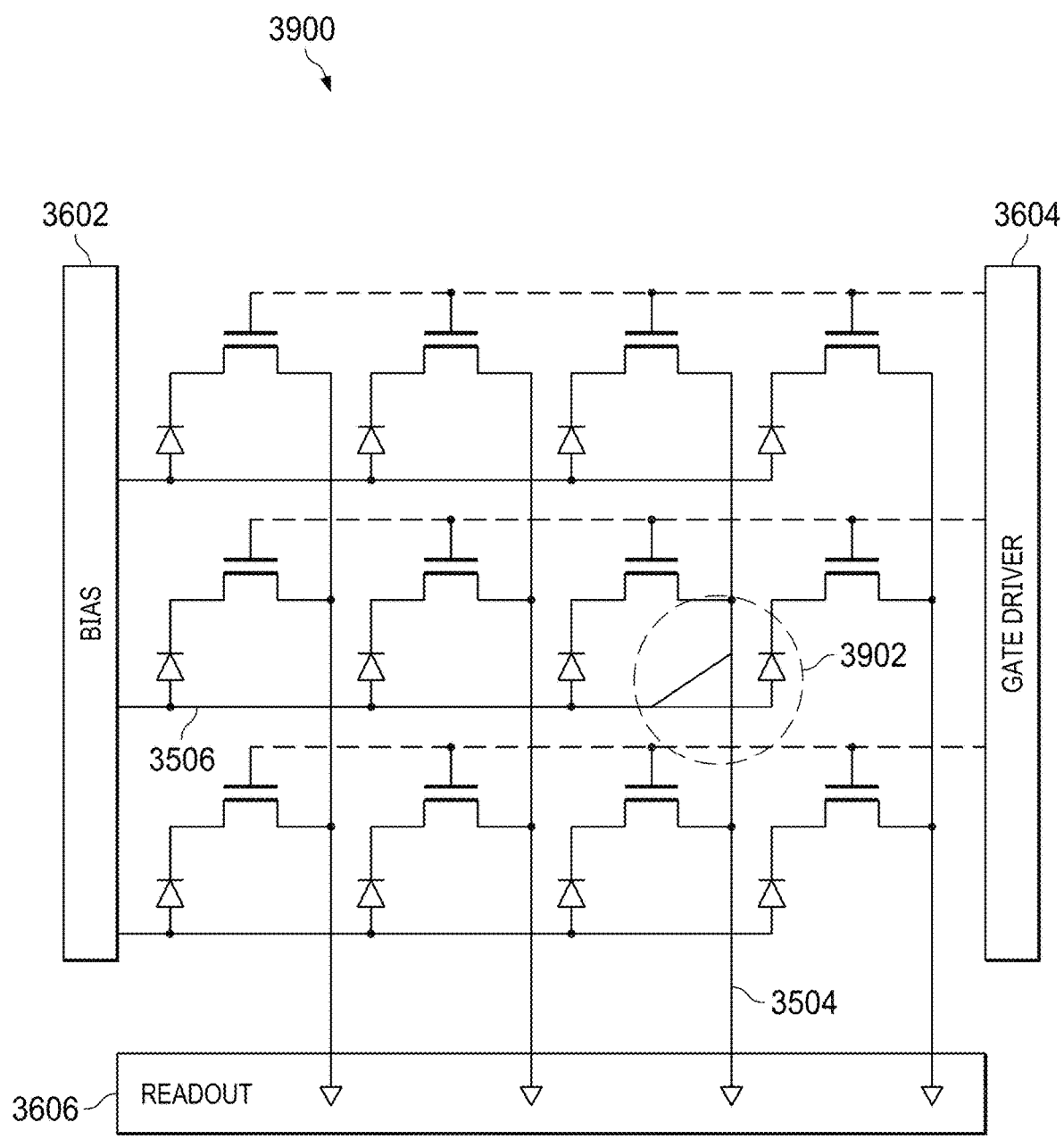
FIG. 39 is an image sensor pixel array as shown in FIG. 36, but including a short circuit between a data line and a bias line.

According to an embodiment, FIG. 35 is a schematic of a single pixel according to an embodiment; FIG. 36 is a schematic of an image sensor pixel array including a plurality of pixels of the type shown in FIG. 35; FIG. 37 is an image sensor pixel array as shown in FIG. 36, but including an open circuit in the data line; FIG. 38 is an image sensor pixel array as shown in FIG. 36, but including an open circuit in the gate line; and FIG. 39 is an image sensor pixel array as shown in FIG. 36, but including a short circuit between a data line and a bias line. These figures are described in further detail below.

Figure 1:
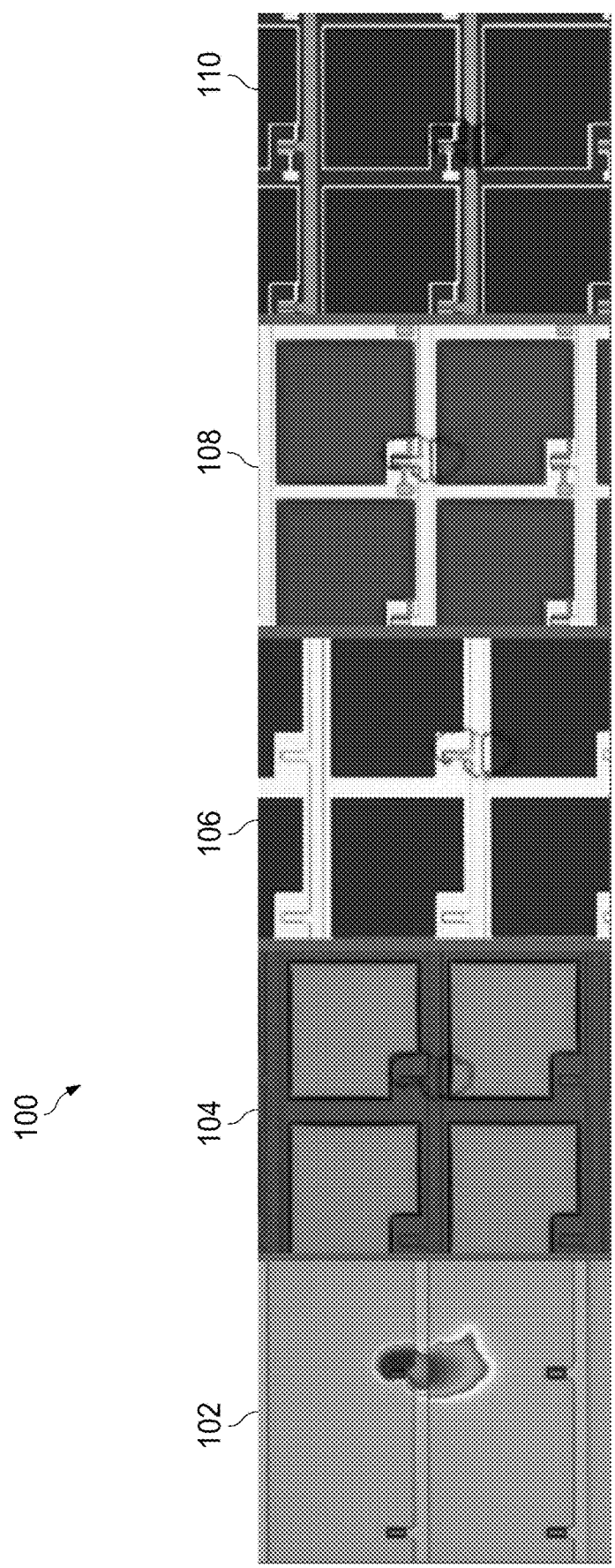
FIG. 1 shows a series of sequential mask layers, wherein a defect in a lower mask layer propagates through to a higher mask layer.
Figure 2:
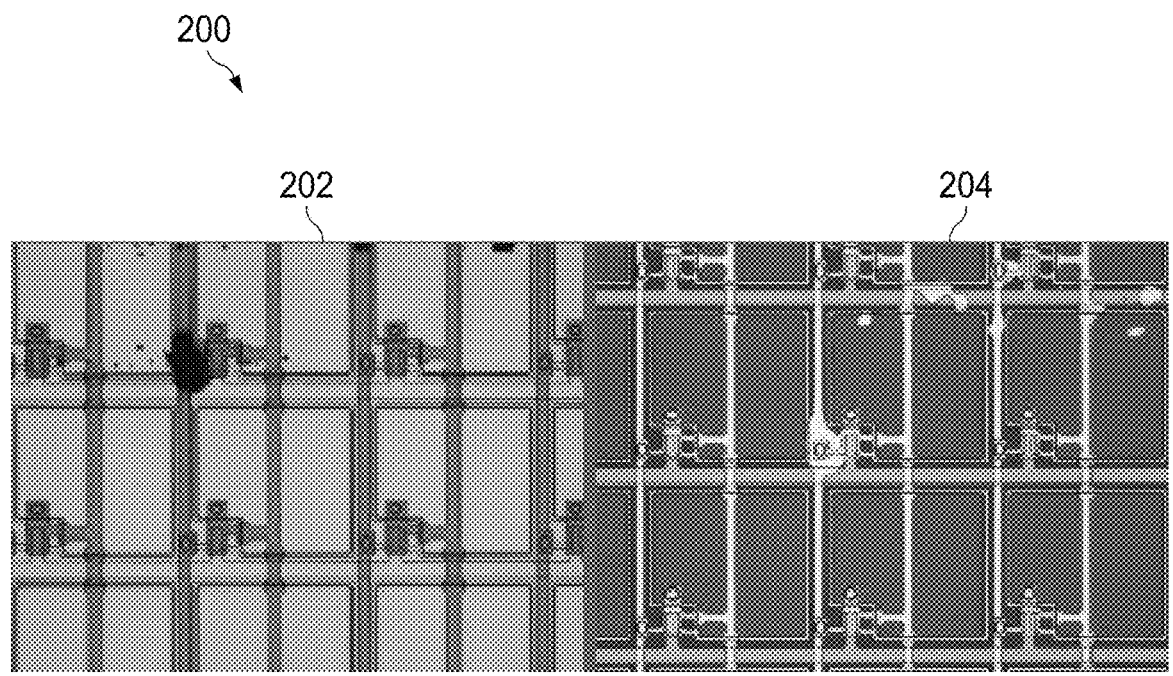
FIG. 2 shows defects causing an electrical short between data and bias lines in an image sensor array.
Figure 3:
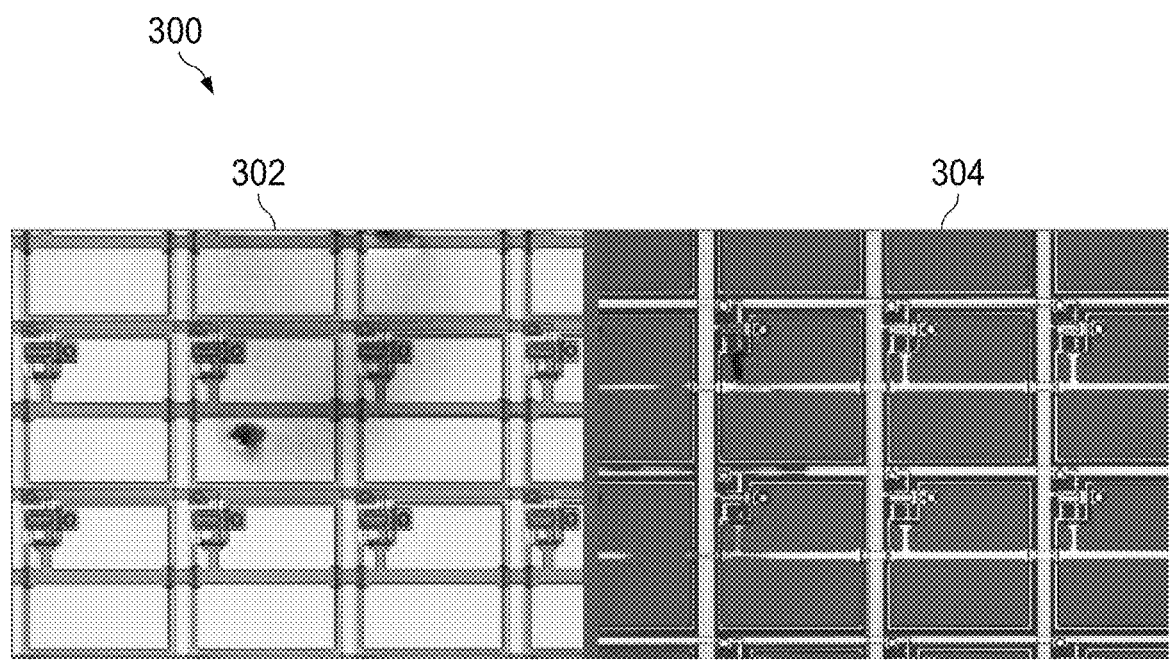
FIG. 3 shows defects causing an electrical open between data and bias lines in an image sensor array.

Defects in the film deposition or in the lithographic masking layer tend to affect the quality of the array in a negative way. In FIG. 1, consecutively implemented mask layers 102, 104, 106, 108, and no are shown. A defect present in one of the first layers, such as layer 102 leads to a gate open in a subsequent layer, such as layer no. In FIG. 2 and FIG. 3 defects in the lithographic masking layer result in electrical shorts and opens in the Data and Bias transmission lines of the sensor array. FIG. 2 shows typical optical microscope images 200 taken inline of a Data to Bias short, including a Data mask 202 and a Bias mask 204. A defect at the lithographic masking layer often causes a weak or hard electrical short between the Data and Bias Transmission Lines. FIG. 3 shows typical optical microscope images 300 taken inline of an open transmission Line, including a data mask 302 and a Bias mask 304. A defect at the lithographic masking layer often causes electrical open-circuits in the data and bias lines.

Embodiment methods improve manufacturing yield, providing an in-line method for electrically grounding opens and shorts in metal transmission lines, to prevent unintended image artifacts caused by floating voltages associated with environmental noise.

Embodiment methods implement the combination of laser-welding parameters, the functionality of the materials architecture, as well as the preferred embodiments and geometries of the laser and the via structure, as is described in further detail below. For arrays that are affected by these opens or shorts in the transmission lines, an embodiment method to repair may include:

1. Batches of arrays are processed using standard manufacturing protocol. For example:
  1.1. A thin film may be deposited
  1.2. A lithographic pattern is transferred to the array
  1.3. The thin film is etched to remove unwanted regions from the array.
  1.4. The cycle is repeated for each layer building up an array of pixels.
2. The array is tested functionally to identify defects associated with open or shorted transmission lines.
  2.1. The open lines themselves are cut in the periphery of the array to remove their influence on the image quality. However, the transmission lines in the active area are still at a floating voltage.
  2.2. The peripheral metal-dielectric-metal structures are illuminated with the laser to weld the top metal to the bottom metal of the structure. An example of this structure/process is described below with reference to FIGS. 4A and 4B.

Figure 4A:
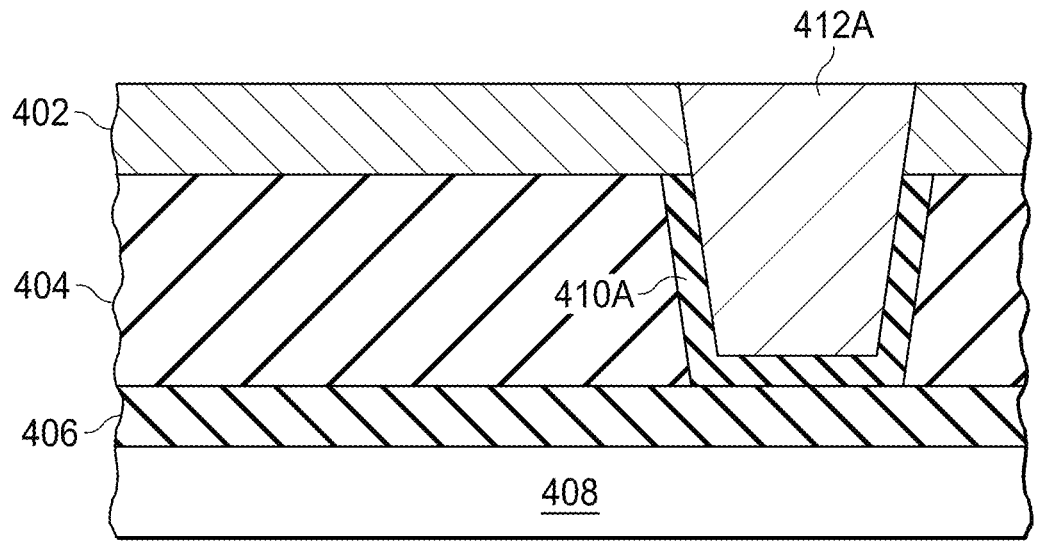
FIG. 4A shows a via for welding a top metal layer to a bias plane before welding, according to an embodiment.
Figure 4B:
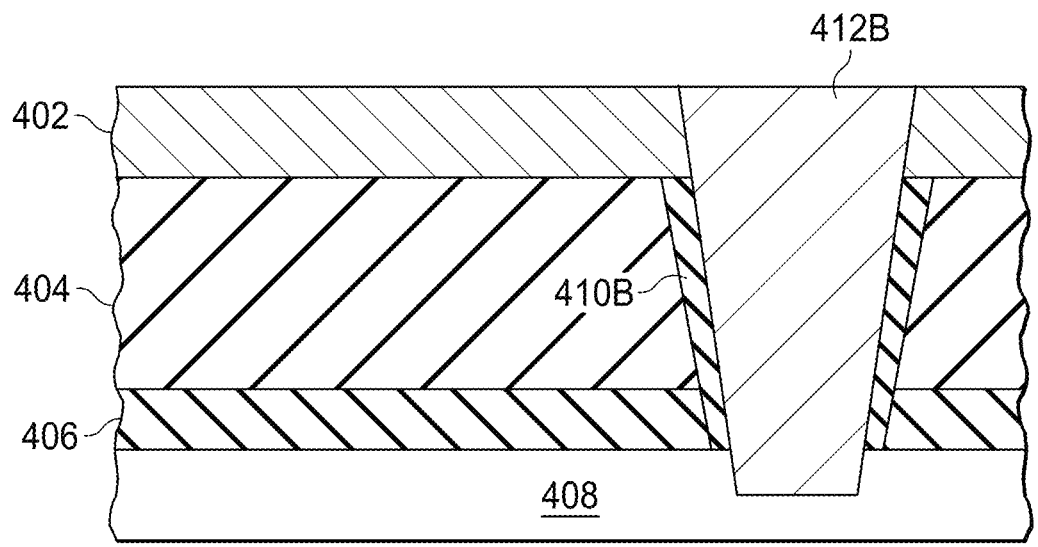
FIG. 4B shows the via actually welding the top metal layer to the bias plane after welding, according to an embodiment.

One aspect of an embodiment method is the architecture of the metal-dielectric-metal "via" structure that is to be used. One example of this via structure is shown in FIGS. 4A and 4B. In this architecture there are two metal films, specifically the Top Metal 402 and the Ground Plane metal 408. The bottom dielectric layer 406 is intended to act as an insulating barrier between the two metal lines 402 and 408. The Top Dielectric 404 is to increase the distance between the lines 402 and 408 and minimize parasitic capacitances that may between the two metal lines. FIG. 4A shows an intact via 412A and an associated insulating layer 410A. It should be noted that in FIG. 4A, before the application of a laser pulse, conductive via 412A is clearly electrically coupled to the top metal line 402 and insulated from the ground plane 408. It should be noted further that in FIG. 4B, after the application of an effective laser pulse (described in further detail below) conductive via 412B extends through a bottom portion of insulating layer 410B and through both dielectric layers 404 and 406, such that conductive via 412B is clearly electrically coupled both to the top metal line 402 and to the ground plane 408.

In a Second aspect, the bottom dielectric 406 may be composed of different layers of dielectric films, or may be a single bulk film. Embodiments can include SiN or SiN/a-Silicon/SiN, SiN/SiO2, $SiO_xN_y$, or variants thereof.

In a Third aspect, the thickness of the bottom dielectric film 406 is not to exceed one μm in thickness and much thinner dielectric films can be used and desirable in embodiments.

In a Fourth aspect, the laser used for welding the Top Metal 402 to the Ground Bias 408 may of any wavelength in the electromagnetic spectrum from UV to IR. A preferred embodiment is UV for certain image sensor applications.

In a Fifth aspect, multiple wavelengths may be used for additional annealing of the metal. In one embodiment (see FIG. 6) an IR laser may be used for "re-flowing" the metal layers to secure better electrical contact between top metal and ground.

In a Sixth aspect, the geometry of the via is generally oblong so as to accommodate a high density of parallel vias associated with each transmission line. In an embodiment, the via is no wider than 50 microns, and no thinner than 10 µm, but may be as long as needed to allow for a sufficient number of welding points.

In a Seventh aspect, the laser line cut width can be made circular, square, line shaped, or patterned as crossing lines. In an embodiment, horizontal and vertical line cuts are used.

In an Eighth aspect, the spacing between multiple laser-weld cuts within a single via is a significant factor to enhance the quality of the electrical contact. In an embodiment, a distance of at least 5 µm is sufficient to prevent degradation of the electrical contact due to the cuts being located in too close proximity.

In a Ninth aspect, the width of the line cut is also an important factor. In an embodiment, a line width greater than 5 µm but less than 10 µm is used.

A number of laser profiles are shown in FIGS. 5-10 and described below.

Figure 5:
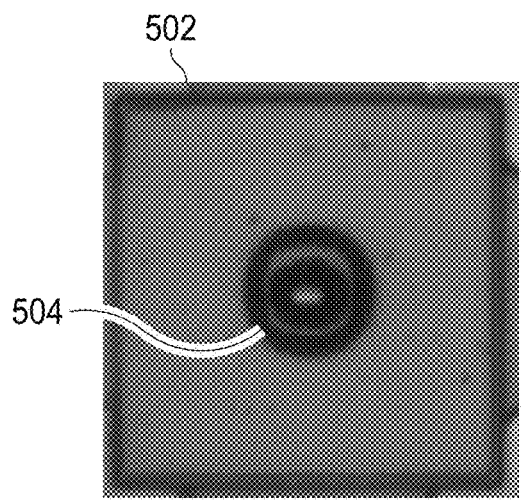
FIGS. 5-9, 10A-10D show examples of various laser profiles used for welding, according to embodiments.

A first example in FIG. 5 shows the plan view of a via 502 and a square laser profile 504. A UV laser is used to ablate the dielectric, and reflow the Data Metal to contact the ground plane.

Figure 6:
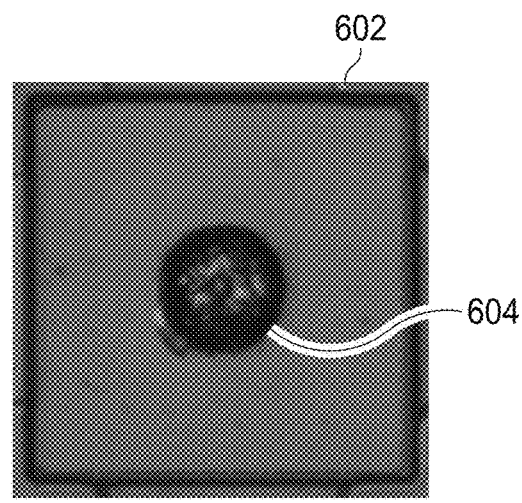

A second example in FIG. 6 shows the plan view of a via 602 and a square laser profile 604. A UV laser is used to ablate the dielectric and make initial electrical contact between the top metal and the bottom ground plane. Using an additional IR laser provides a way to reflow the Data Metal and improve the electrical contact the ground plane.

Figure 7:
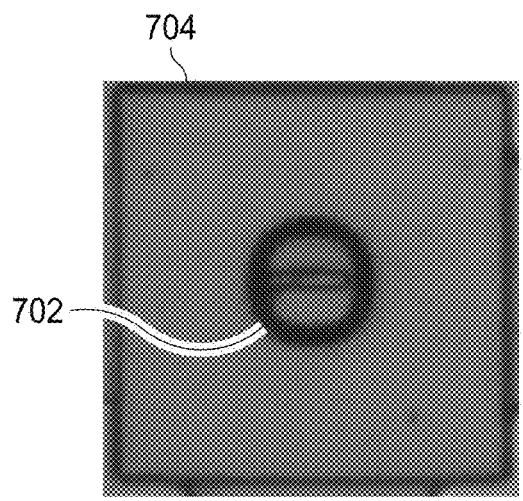

A third example in FIG. 7 shows the plan view of a via 702 and a thin laser profile 704. A UV laser with a thin profile is used.

Figure 8A:
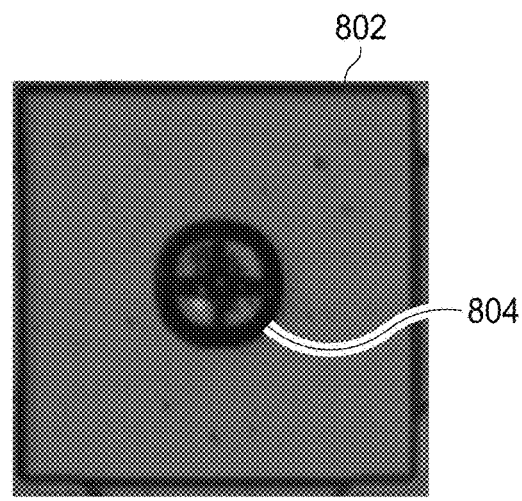
Figure 8B:
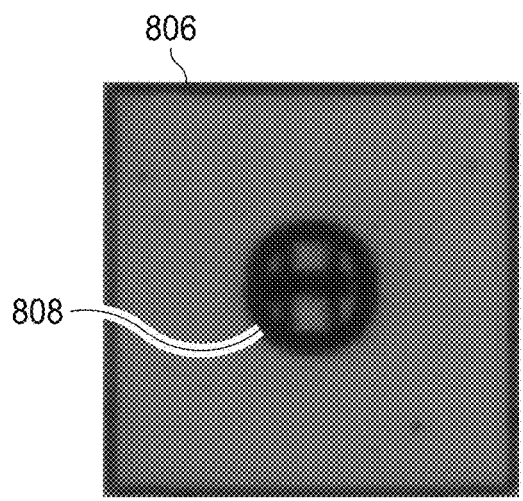

A fourth example in FIGS. 8A and 8B shows a thin laser profile, with crossing patterns. FIG. 8A shows the plan view of a via 802 and a thin laser profile 804, using a first crossing pattern. FIG. 8B shows the plan view of a via 806 and a thin laser profile 806, using a second crossing pattern.

Figure 9:
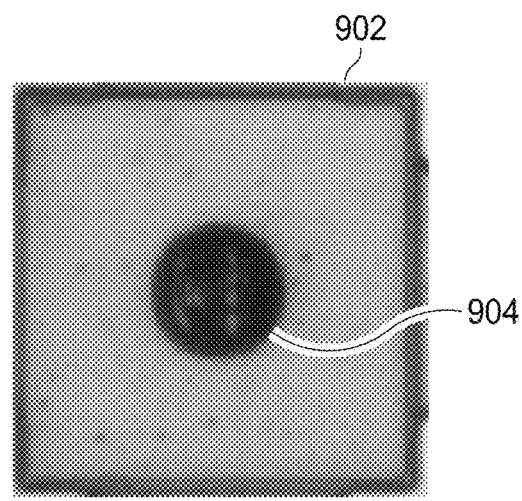

A fifth example in FIG. 9 shows the plan view of a via 902 and a thin laser profile 904. A UV laser with a thin profile and parallel pattern is used.

Figure 10A:
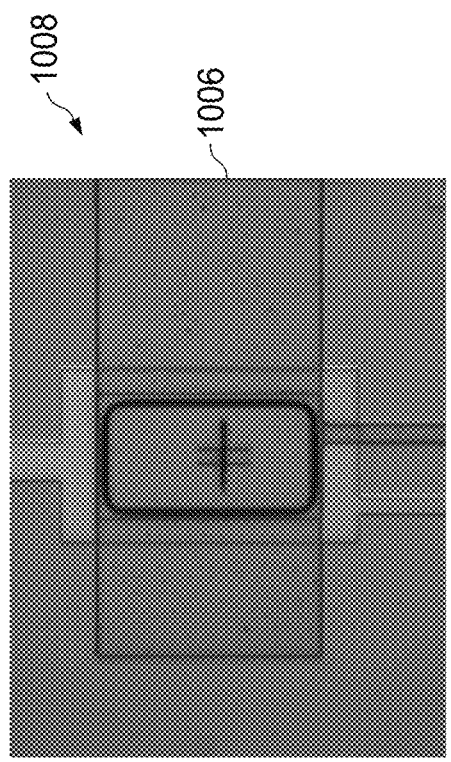
Figure 10B:
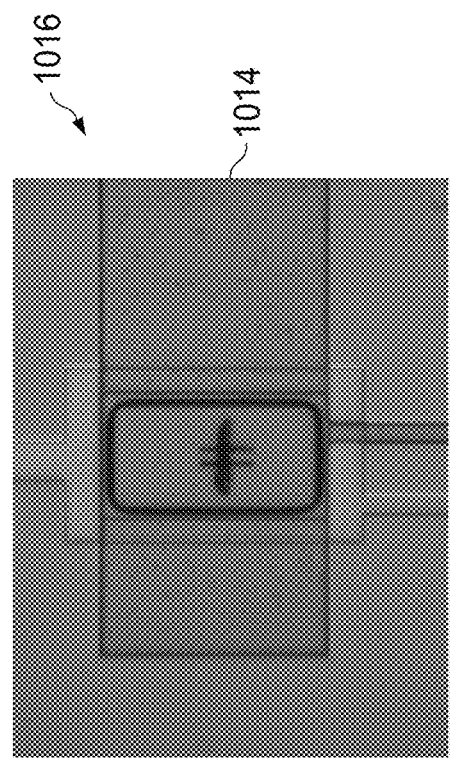
Figure 10C:
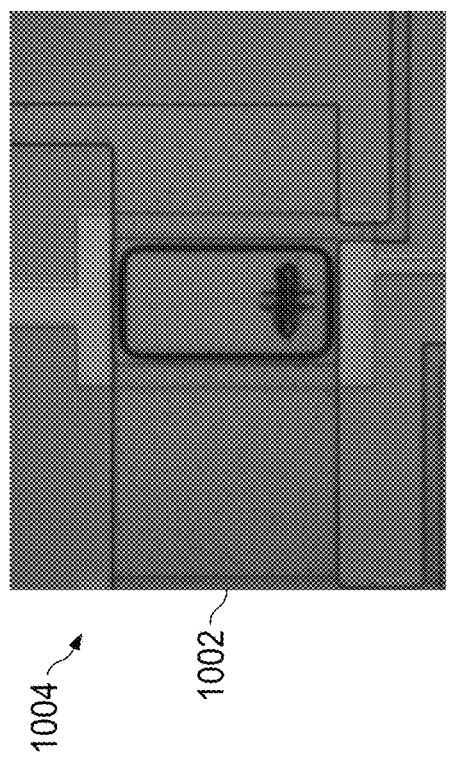
Figure 10D:
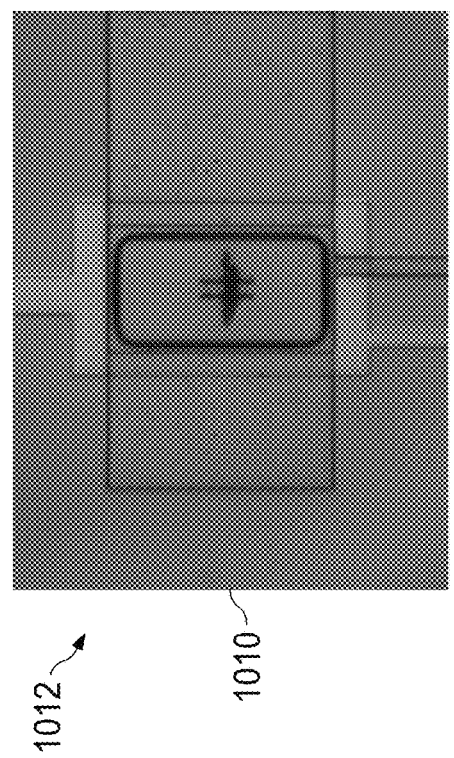

A sixth example in FIGS. 10A-10D shows further images of various thicknesses and locations of laser-weld cuts, according to embodiments. FIG. 10A shows the plan view of a via 1002 and a double cross laser profile 1004 in a bottom location. FIG. 10B shows the plan view of a via 1006 and a double cross laser profile 1008 in a central location. FIG. 10C shows an example of a via 1010 and a double cross laser profile 1012 with a thicker horizontal cut. FIG. 10D shows another example of a via 1014 and a double cross laser profile 1016 with a thicker horizontal cut.

Alternative dielectric layers can be used, including, for example Indium Gallium Zinc Oxide ("IGZO") layers. The top and bottom electrodes previously described may alternatively be comprised of Ti/Al, TiW/Al, Mo/Al, Cr/Al, or other such suitable metals known to those skilled in the art. The laser used for welding may be any laser, appropriately modified, in the UV-IR spectra. The laser-welding via structures may be located in the active area of an image sensor array.

In the current State of the Art, arrays with specification limits which do not allow weak data to bias shorts, or which are having gate opens are typically scrapped because of the image artifact produced by the floating transmission line. For this reason an efficient method for electrically grounding the data transmission line is needed.

In summary, embodiment methods are related to the creation of "Via" structures which may be used for welding any open or electrically shorted data, bias, or gate transmission lines. These via structures have a thin dielectric film separating two adjacent metal contacts. Using a laser of sufficient power and wavelength as described above, the two metals can be joined together to form an electronic junction.

Figure 11A:
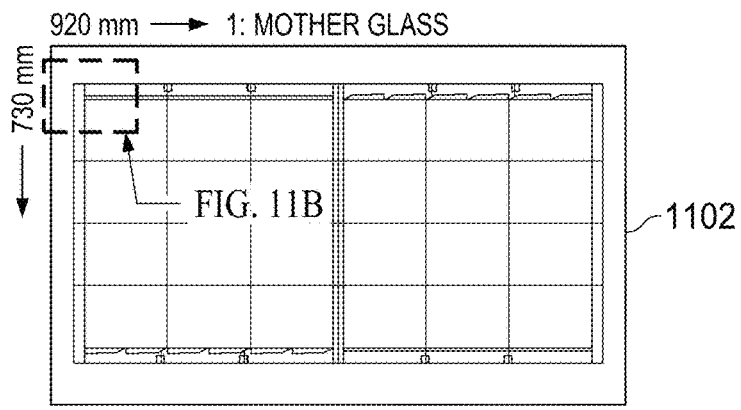
FIGS. 11A-11E show the plan view of laser-welding structures on an image sensor product at various magnifications.
Figure 11B:
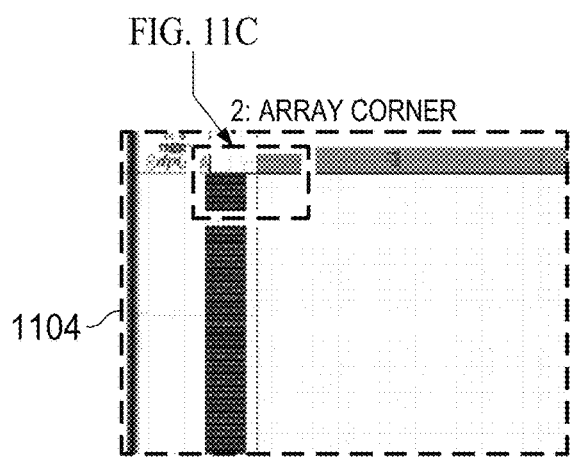
Figure 11C:
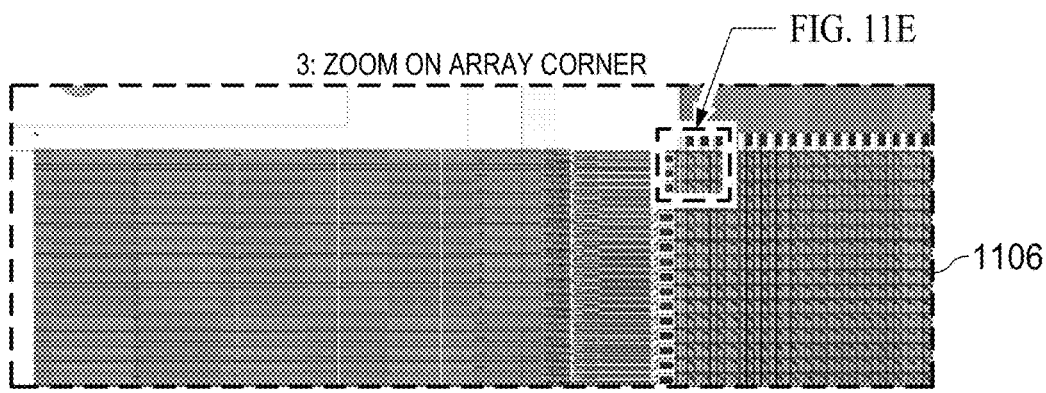
Figure 11D:
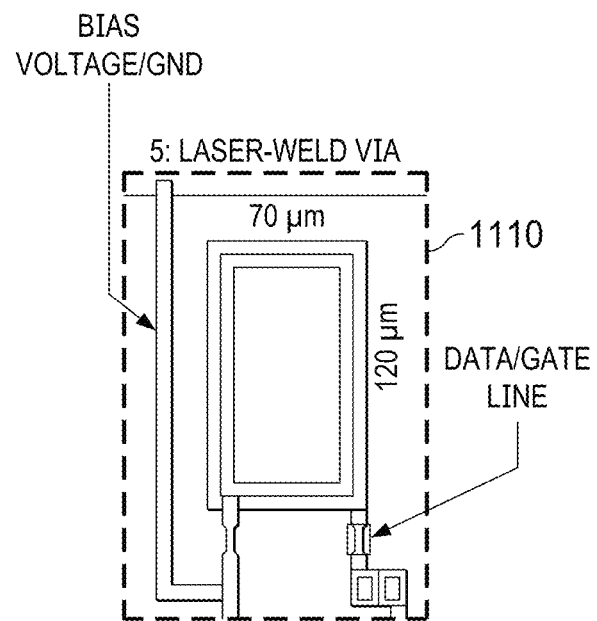
Figure 11E:
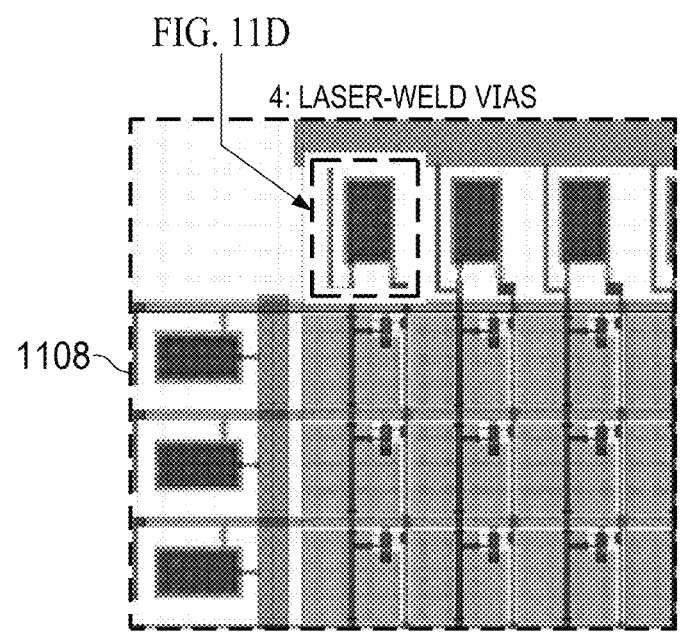

A plan view of laser-welding structures on an example image sensor array product is shown in varying degrees of magnification in FIGS. 11A-11E. FIG. 11A shows a plan view of a glass substrate 1102 including a plurality of image sensor arrays aka "mother glass". FIG. 11B shows a plan view of an array corner 1104 of the mother glass 1102. FIG. 11C shows a plan view of an array corner 1106 of the mother glass 1102 at a higher magnification level. FIG. 11E shows a plurality of laser-weld vias 1108 associated with an active area of an image sensor array. FIG. 11D shows a plan view of a laser-weld via 1110 including the associated bias voltage/GND and data/gate lines associated with the active area of the image sensor array.

Figure 12:
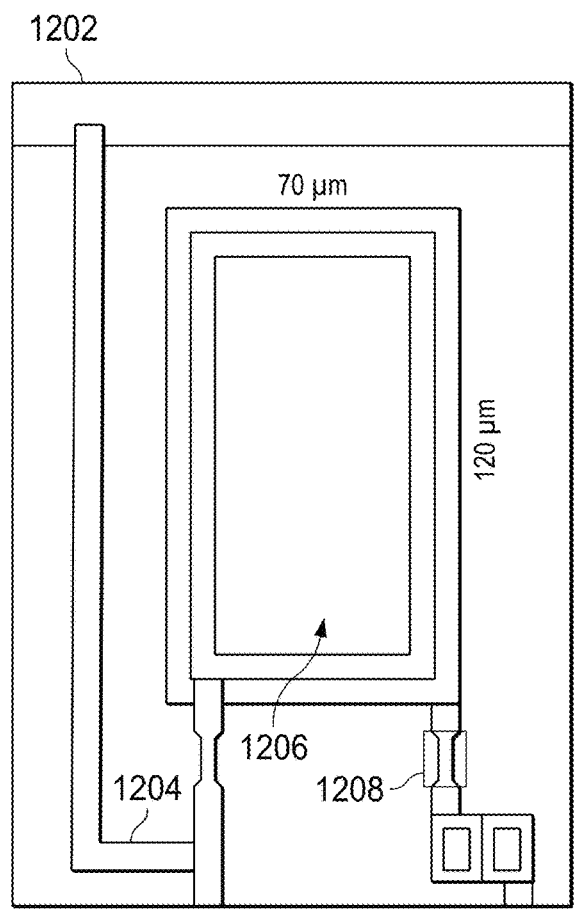
FIG. 12 shows a detailed plan view of a laser-weld via, according to an embodiment.

FIG. 12 shows in detail a plan view of a laser-weld via and related structures 1202, including the laser-weld via 1206, the bias voltage/GND line 1204, and the data/gate line 1208. In an embodiment, the laser-weld via has a footprint of 70 µm by 120 µm in the plan view.

Figure 13:
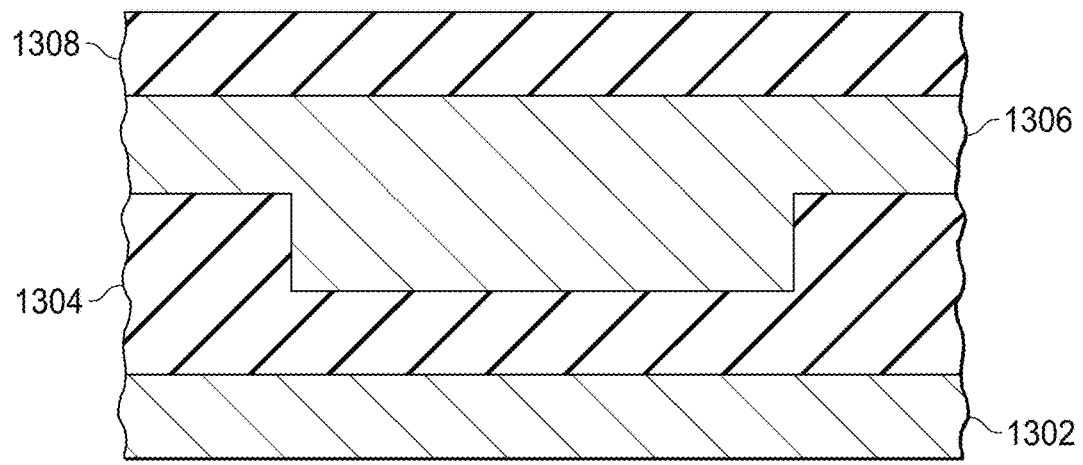
FIG. 13 shows a cross-sectional view of the laser-weld via before welding, according to an embodiment.

FIG. 13 shows a cross-sectional view of the laser-weld via in an embodiment, including the data/gate line (Metal 1) 1302, the first dielectric layer 1304, the bias voltage/GND line (Metal 2) 1306, and second dielectric layer 1308. Before the laser-weld it can be seen in FIG. 13 that there is no electrical contact between the Metal 1 and Metal 2 layers.

Figure 14:
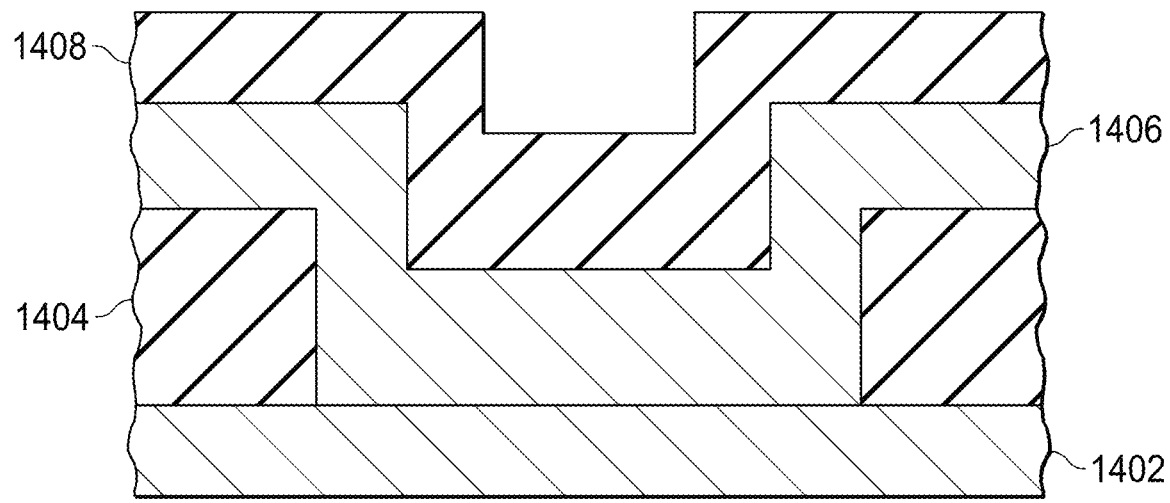
FIG. 14 shows a cross-sectional view of the laser-weld via after welding, according to an embodiment.

FIG. 14 shows a cross-sectional view of the laser-weld via in an embodiment, including the data/gate line (Metal 1) 1402, the first dielectric layer 1404, the bias voltage/GND line (Metal 2) 1406, and second dielectric layer 1408. After the laser-weld it can be seen in FIG. 14 that there is an electrical contact between the Metal 1 and Metal 2 layers.

Figure 15:
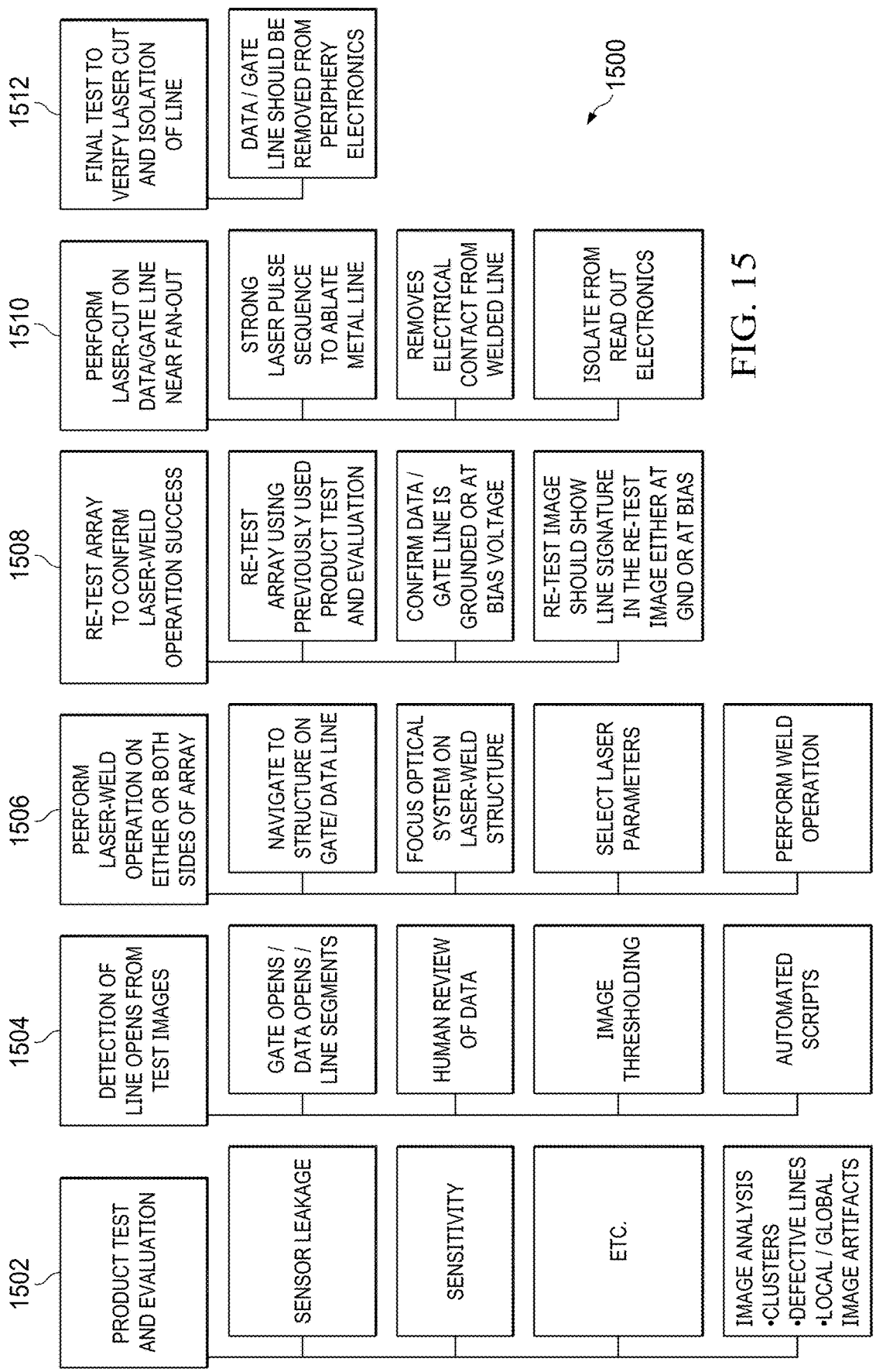
FIG. 15 is a flow chart of a laser-welding method suitable for use in an image sensor product according to an embodiment.

An embodiment method flow 1500 is shown in the flow chart of FIG. 15. In pertinent part, the method flow 1500 includes a product test and evaluation step 1502, detection of line opens from test images 1504, performing a laser-weld operation on either or both sides of an array 1506, re-testing the array to confirm laser-weld operational success 1508, performing a laser-cut on the data/gate line near fan-out (peripheral readout) 1510, and a final test to verify the laser cut and isolation of the line 1512. All of these steps include numerous aspects, which are all explain in further detail below.

Figure 16:
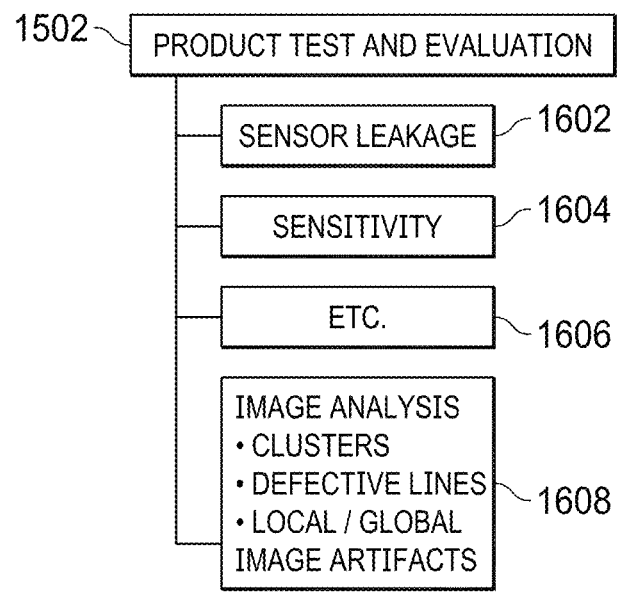
FIGS. 16 and 17 illustrate further details of the product test and evaluation step of the flow chart of FIG. 15.

FIG. 16 shows a block diagram of the product test and evaluation step, including electrical tests such as sensor leakage and sensitivity tests, which are electrical tests, and an image analysis including the visual identification of clusters, defective lines, as well as other local and global image artifacts.

Initial tests are performed to evaluate product at end of manufacturing line. Standard imaging tests evaluating photodiode sensitivity, TFT leakage, Gain, Sensitivity, and other electrical tests can be performed. The glass substrate including the image sensor array products is loaded onto and aligned to a test station. The test station has probes that are aligned to the product, and which descend onto the glass. The probes are used for evaluating array imaging capability.

Figure 17:
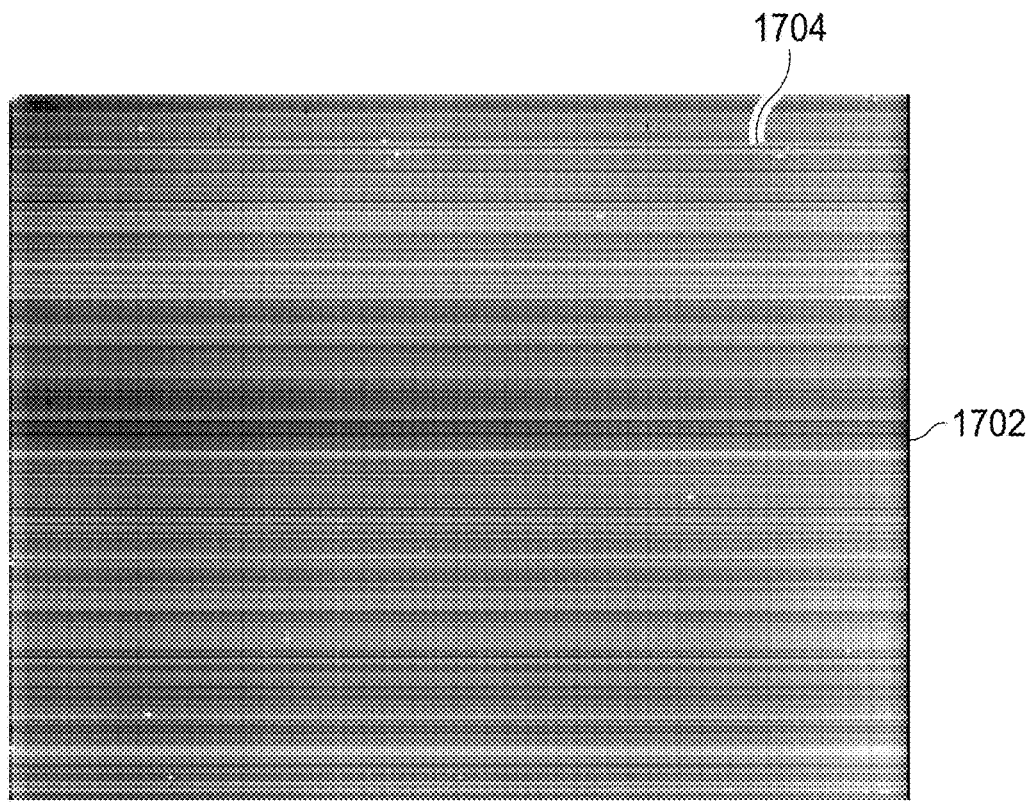

FIG. 17 is an example of a test image 1702 used for product evaluation, including at least one failing pixel 1704.

Figure 18:
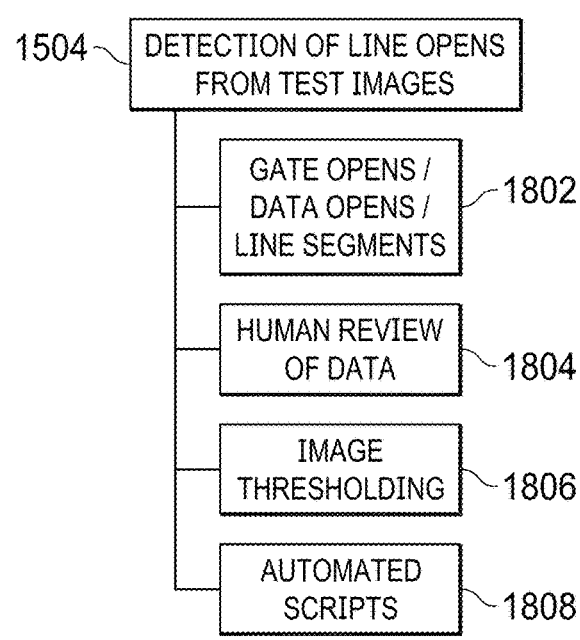
FIGS. 18 and 19 illustrate further details of the defect detection step of the flow chart of FIG. 15.

FIG. 18 is a block diagram describing further details associated with the detection of line opens from test images step 1504, including detection of gate opens, data opens, data-bias shorts, and line segments from electrical test data 1802, human review of the test data 1804, image thresholding 1806, and generation of automated scripts 1808. When there is a line defect in the image (line open or line short), the pixel values along that line or line segment are statistically different from other pixels in the image. For example, line opens typically have low to zero digital numbers representative of no data/voltage being read out of the open line. Alternatively, pixels located along line shorts (such as data-bias shorts) saturate the readout electronics. Consequently using simple statistical methods such as means and variances, outlier pixels may be identified quite readily. Depending on the product and specification, individual gate and/or data lines may be flagged. Flagging can be done automatically or after human review of image data or by implementing these statistical thresholding algorithms. Should these defective lines be flagged, the coordinates can be recorded for laser-welding repair.

Figure 19:
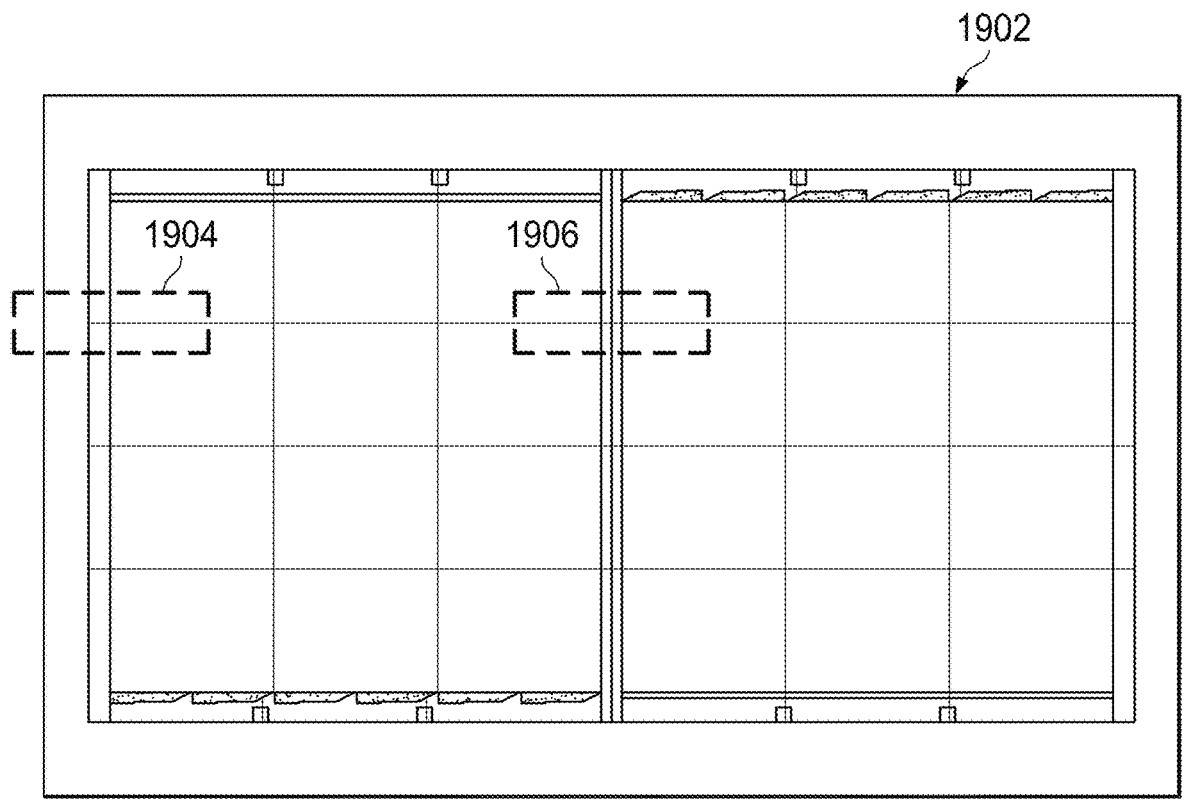

FIG. 19 shows the glass substrate 1902 including the image sensor arrays including portions 1904 and 1906 thereof wherein laser-welds can be performed. Either or both portions 1904 and 1906 associated with an open line can be laser-welded as previously described.

Figure 20:
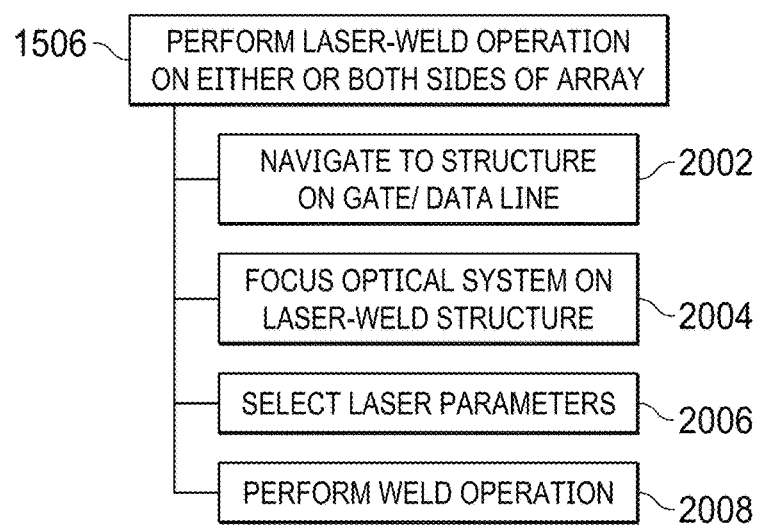

FIG. 20 is a block diagram describing further details associated with the performing the laser-weld operation on either or both sides of the array step 1506, including navigating to the laser-weld structure (via in plan view) associated with the affected gate and/or data line 2002, focusing the optical system on the laser-weld structure 2004, selecting the laser parameters 2006, and performing the laser-weld operation 2008. Arrays that are flagged for laser repair are returned to laser-welding equipment. The glass is loaded into the optical alignment system. For each product the system is aligned using fixed alignment points. The coordinates of the laser repair are then entered and the system navigates using x-y stage to location of gate/data line. Once at the location the user can auto-focus the laser system to the laser-welding structure. The laser-welding parameters are selected and the weld-structures are welded.

FIG. 21A shows an active array portion 2102 including the plan view of a weld-structure (via) 2104 before welding. FIG. 21B shows the same active array portion 2102 including the plan of the weld-structure (via) 2106 after welding. In this case, a double cross pattern was selected by the user and the burned-in double cross pattern made by the laser is clearly visible in FIG. 21B.

FIG. 22 is a block diagram describing further details of the re-testing the array to confirm that the laser-weld operation was a success 1508, including re-testing the array using previously used product test and evaluation 2202, confirming that the data/gate line is ground or at the bias voltage 2204, and the re-tested image shows a line signature in the re-test image either at GND or at the bias voltage 2206. Testing is required after laser-welding to confirm electrical contact between line and GND/BIAS.

Figure 23:
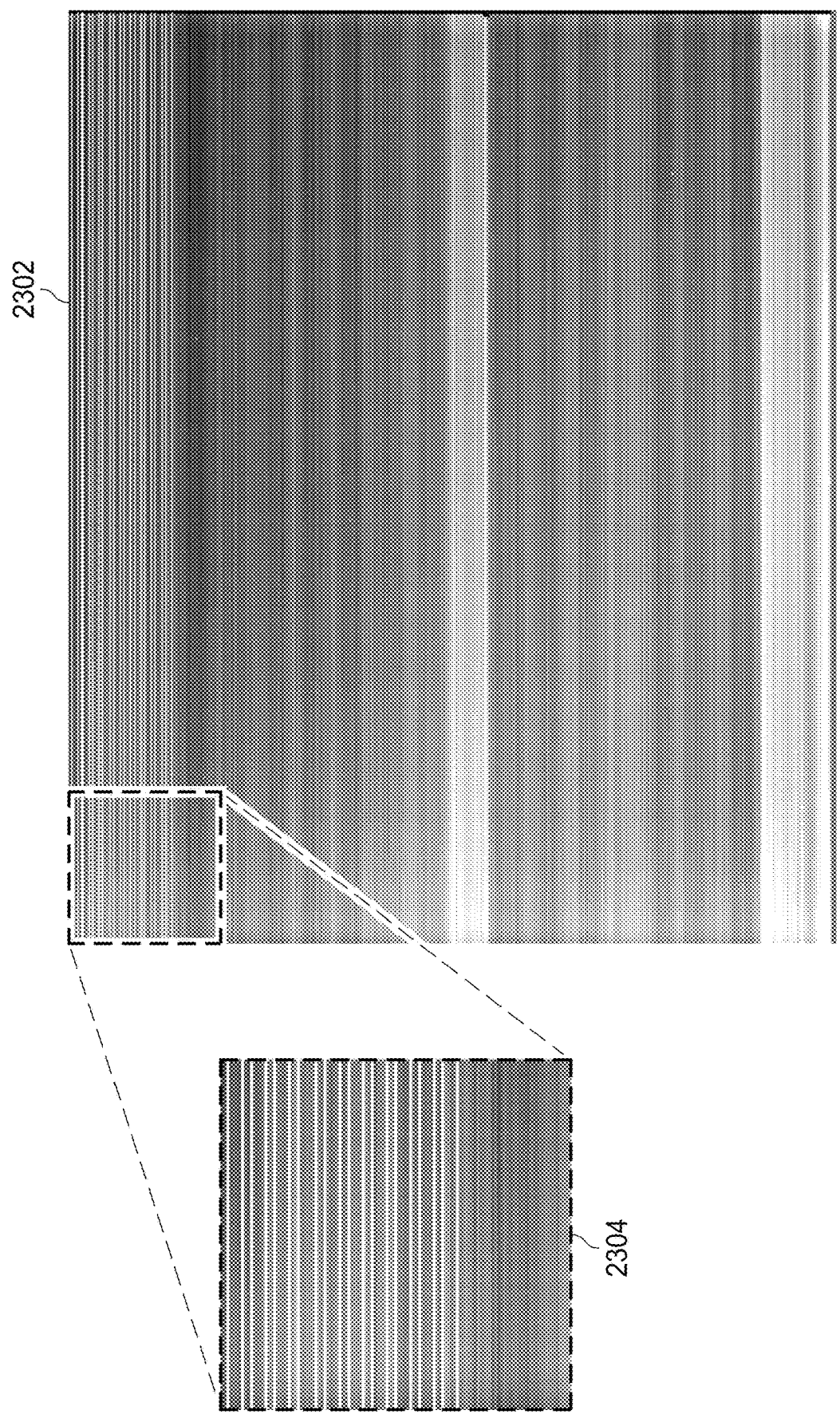

FIG. 23 shows an image signature after welding showing saturation of the data line due to laser-welding with BIAS. This hard short between BIAS and Data-line confirms success of laser-welding. Image 2302 shows an entire array wherein a plurality of open lines has been repaired, indicated by white stripes in the image. A magnified image portion 2304 shows the white stripes indicated repaired lines in further detail. In FIG. 23, the white lines indicate that the data/gate lines have been shorted to the ground/bias voltage by the laser-welding.

Figure 24:
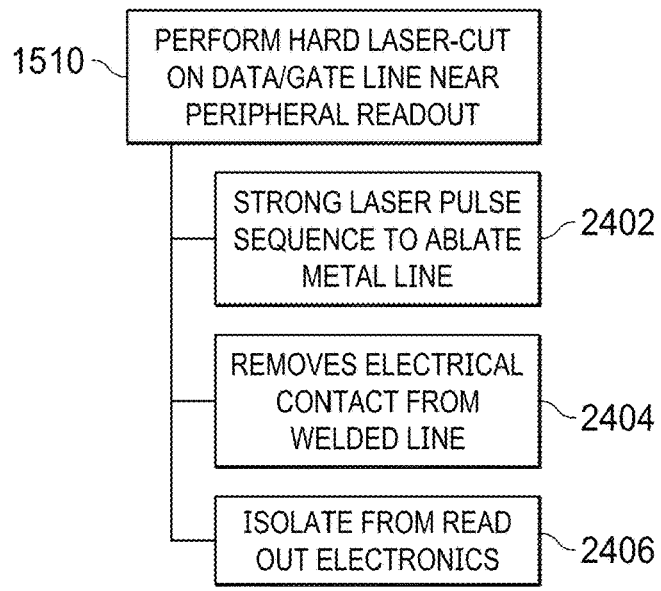
FIGS. 24, 25, and 26 illustrate further details of the hard laser cut step of the flow chart of FIG. 15.

FIG. 24 is a block diagram describing further details of the perform hard laser-cut on data/gate line near peripheral readout step 1510, including using a strong laser pulse sequence to ablate a readout portion of the welded line 2402, which removes electrical contact from the welded line 2404, and isolates the welded line from the read out electronics 2406. After laser-welding has confirmed that the defective line has been connected to BIAS/GND, the line is cut from the periphery of the product. This removes the defective line from the read out electronics. The line cutting may be done using simple laser ablation of the metal line.

Figure 25:
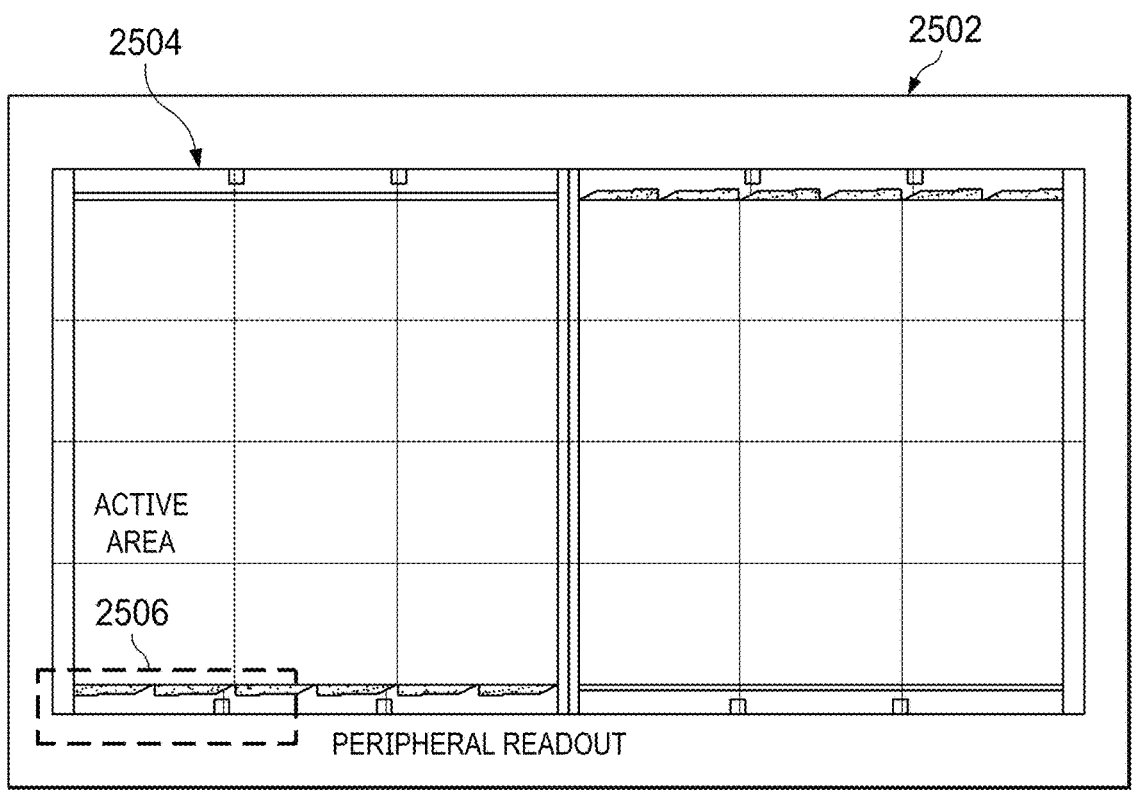

FIG. 25 shows an image sensor array product 2502 on a glass substrate, including an active array portion 2504, and a peripheral readout portion 2506.

Figure 26:
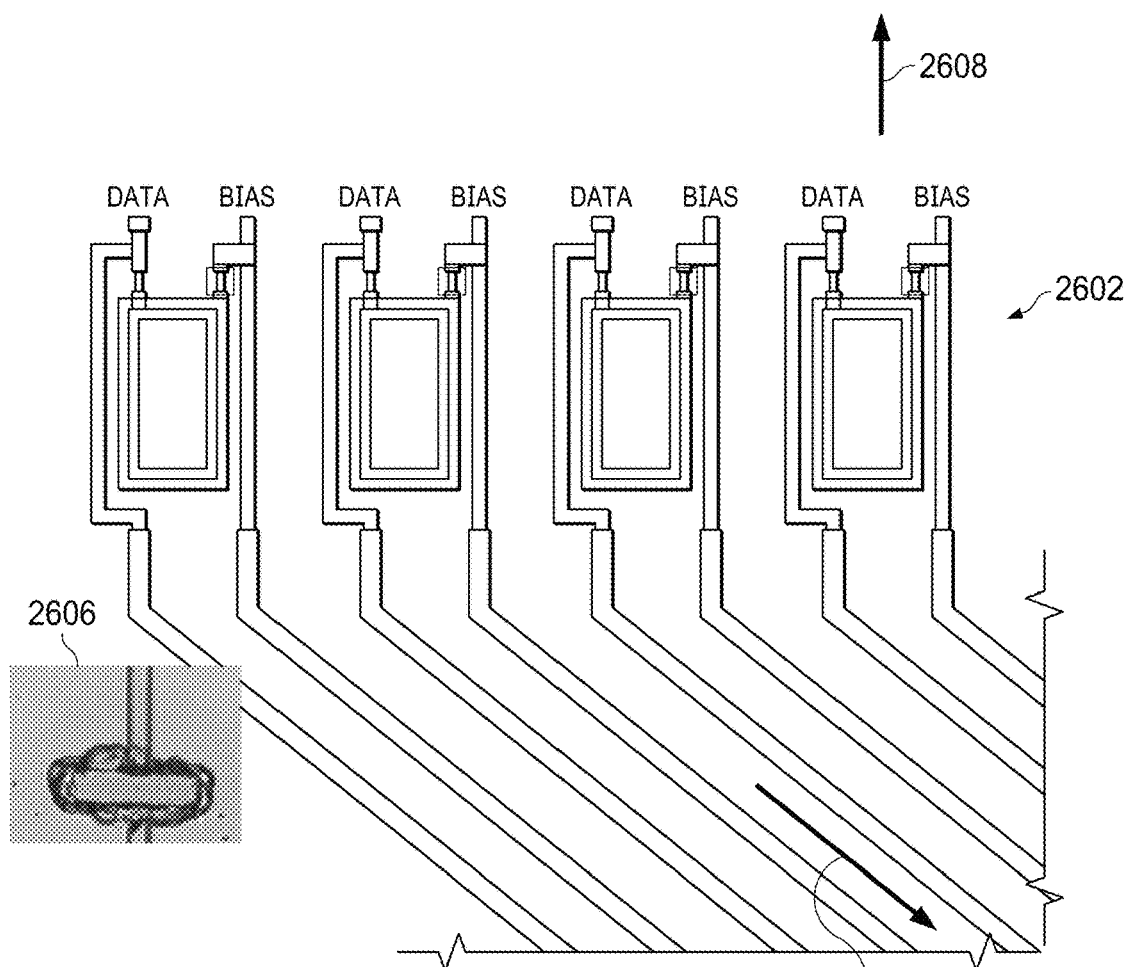

FIG. 26 shows further details of the peripheral readout portion 2506, including a plurality of laser-welding structures 2602, lines 2604 that are used to connect to peripheral read out electronics, a hard laser cut 2606 through one of lines 2604 that extends completely through the line and down to the glass substrate, and DATA and Bias lines 2608 that extend back into the active area of the image sensor array product. Figure also shows that the hard laser cut 2606 was made with a rectangular shaped laser pulse and has completely severed one of the lines 2604 and left a glass artifact from the heat associated with the laser pulse(s).

Figure 27:
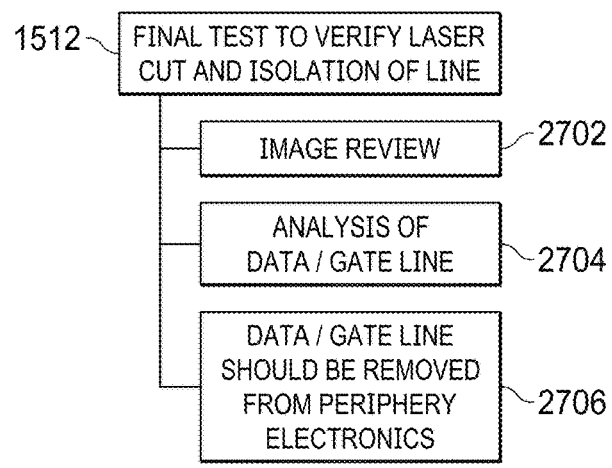
FIG. 27 illustrates further details of the final test step of the flow chart of FIG. 15.
Figure 28A:
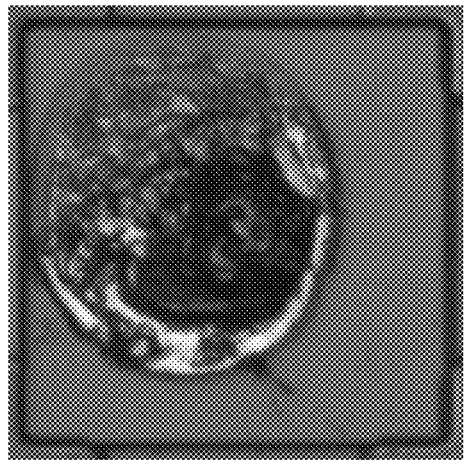
FIGS. 28A-28D show low success-rate weld patterns.
Figure 28B:
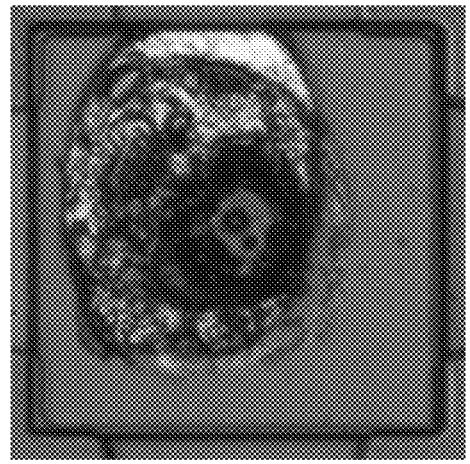
Figure 28C:
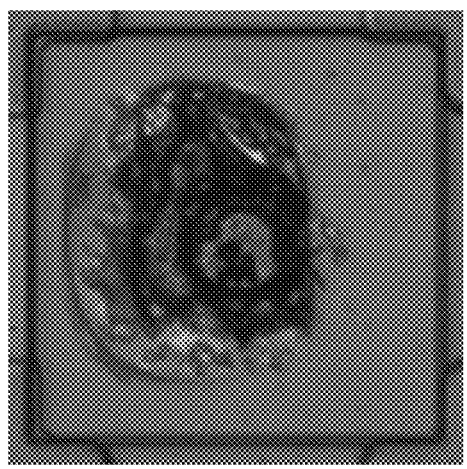
Figure 28D:
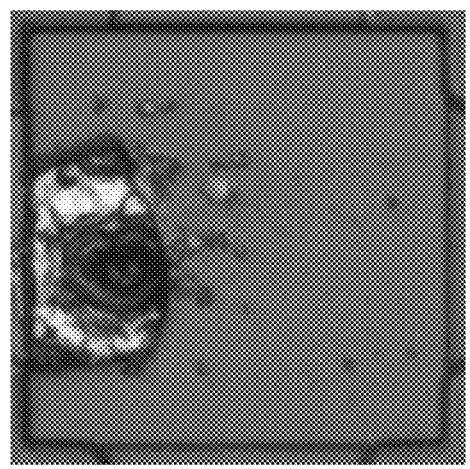

FIG. 27 shows a block diagram describing further details of the final test to verify the laser cut and isolation of the readout line step 1512, including image review 2702, analysis of the data/gate line 2704, and that the data/gate line is removed from the periphery electronics 2706. Testing is required after the hard laser cut to confirm the line has been removed from the readout electronics. The selected line should read out as a logic zero in the image as no voltage is being applied to the line and should no longer be saturated.

FIGS. 28A-28D show a plurality of low success-rate weld patterns that use high power and higher pulse frequency laser pulses. These patterns yielded very poor results, in that they did not always guarantee that the data/gate line was effectively welded to the bias/GND line.

Figure 29A:
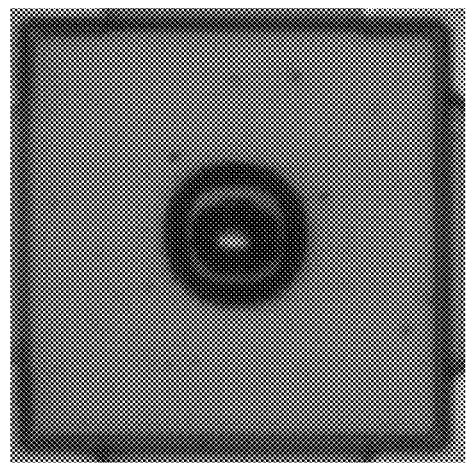
FIGS. 29A-29B also show low success-rate weld patterns.
Figure 29B:
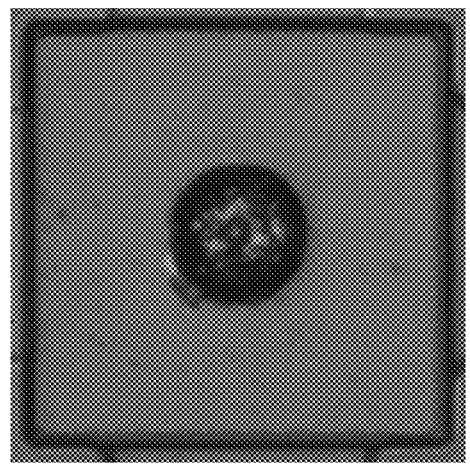
Figure 29C:
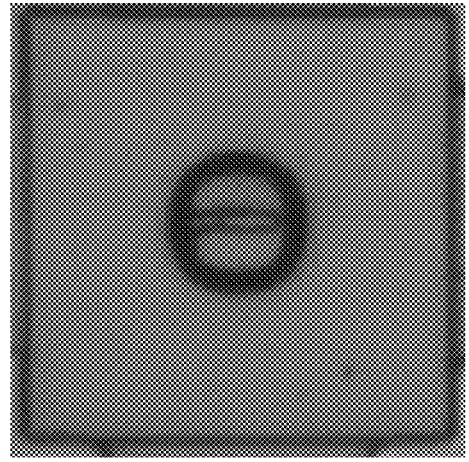
FIGS. 29C-29D show successful weld patterns, according to embodiments.
Figure 29D:
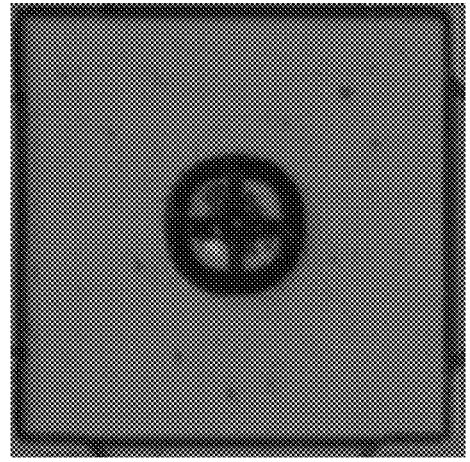

FIGS. 29A and 29B show two additional failing laser-weld patterns, including a UV hole pattern in FIG. 29A, and a UV hole pattern plus an IR reflow shown in FIG. 29B. Using a thinner UV line cut improved welding success. For example, FIG. 29C shows a UV line pattern with or without the IR reflow that resulted in a 25% passage rate. Using two thin UV line cuts (having an increased perimeter) continued to improve welding success. For example, FIG. 29D shows a UV cross pattern with or without IR reflow that resulted in a 75% passage rate.

Figure 30:
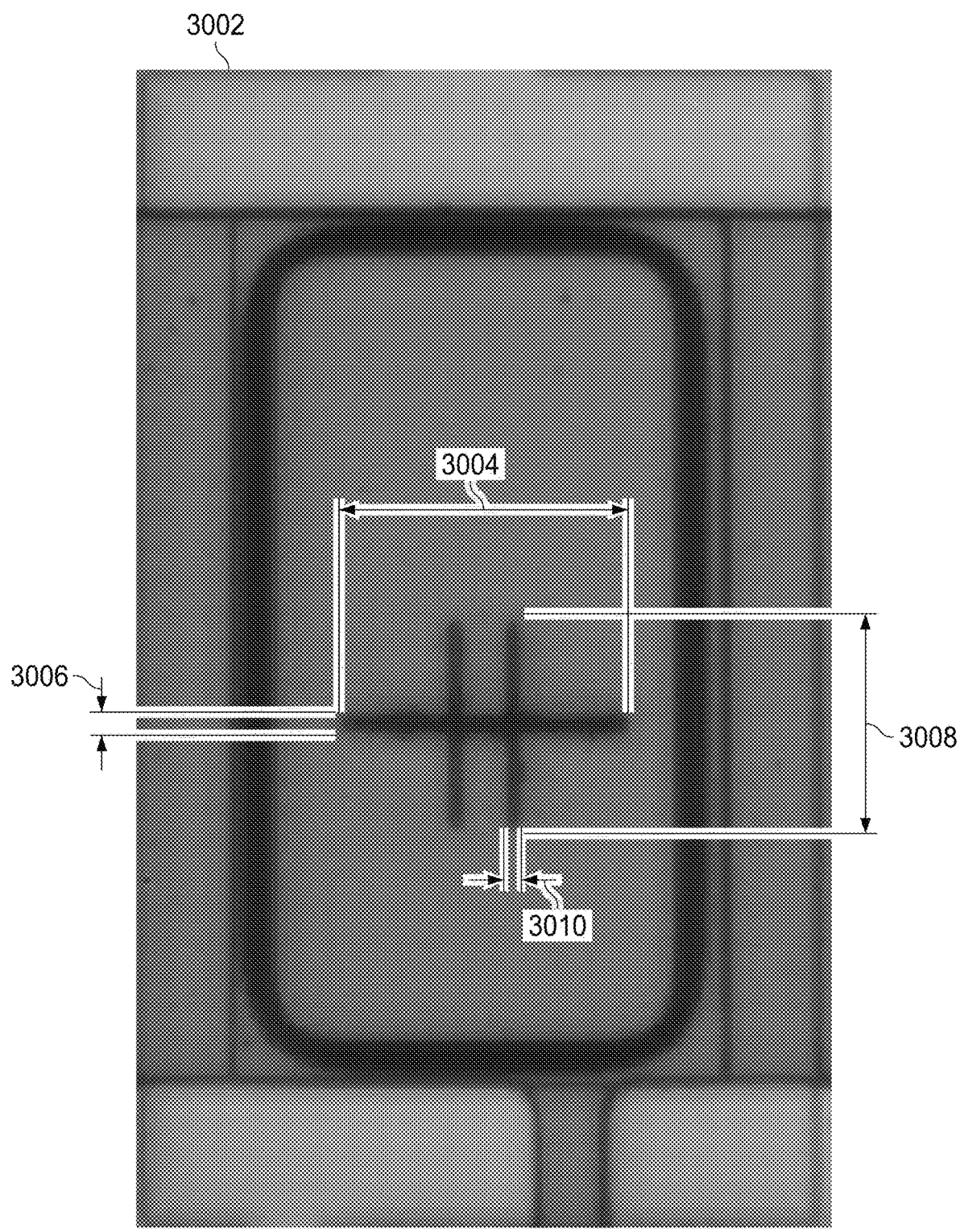
FIG. 30 illustrate laser parameter definitions.

FIG. 30 illustrates various parameter definitions used for evaluating laser pulse performance, including, as shown in weld-structure 3002, horizontal line height 3004, horizontal line width 3006, vertical line height 3008, and vertical line width 3010.

Figures 31, 32A, 32B, 32C, 32D, 32E:
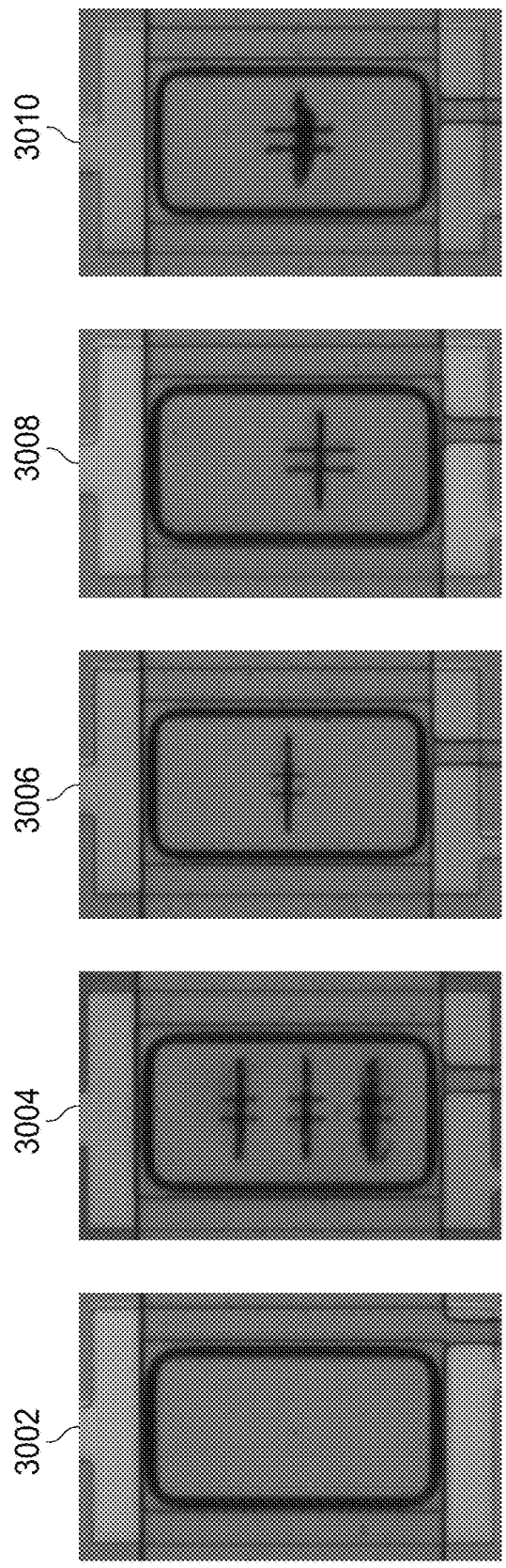
FIGS. 31 and 32A-32E illustrate example conditions of various laser patterns, according to embodiments.

FIG. 31 shows example conditions including reference numbers, number of individual weld patterns "A" through "D", horizontal line width measured in microns, horizontal line height measure in microns, vertical line height measure in microns, vertical line width measured in microns, number of laser pulses between 50 and 100, wavelength, power measured as a percentage of a maximum power, which in this example is 60 micro-joules, and frequency in Hz. The dimensions for the weld pattern are only given as an example, and may have to be changed to accommodate a specific product using different layers and manufacturing techniques.

FIG. 32 shows a weld-structure 3002 before welding, the "A" pattern 3004 after welding, the "B" pattern 3006 after welding, the "C" pattern 3008 after welding, and the "D" pattern 3010 after welding.

Figure 33:
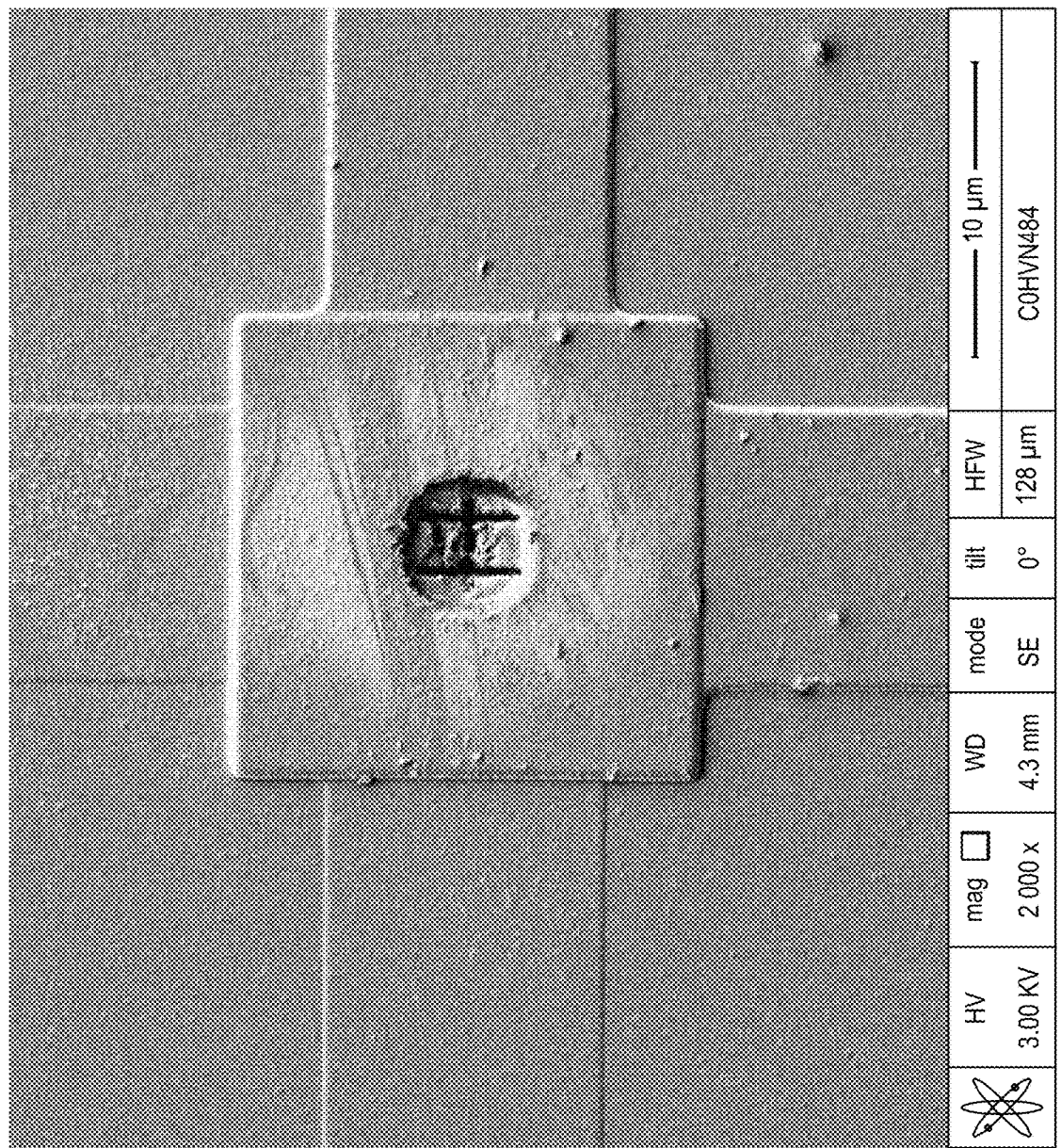
FIG. 33 shows a plan view of a laser-weld structure according to an embodiment.

FIG. 33 shows a welding-structure 3302, according to an embodiment.

Figure 34:
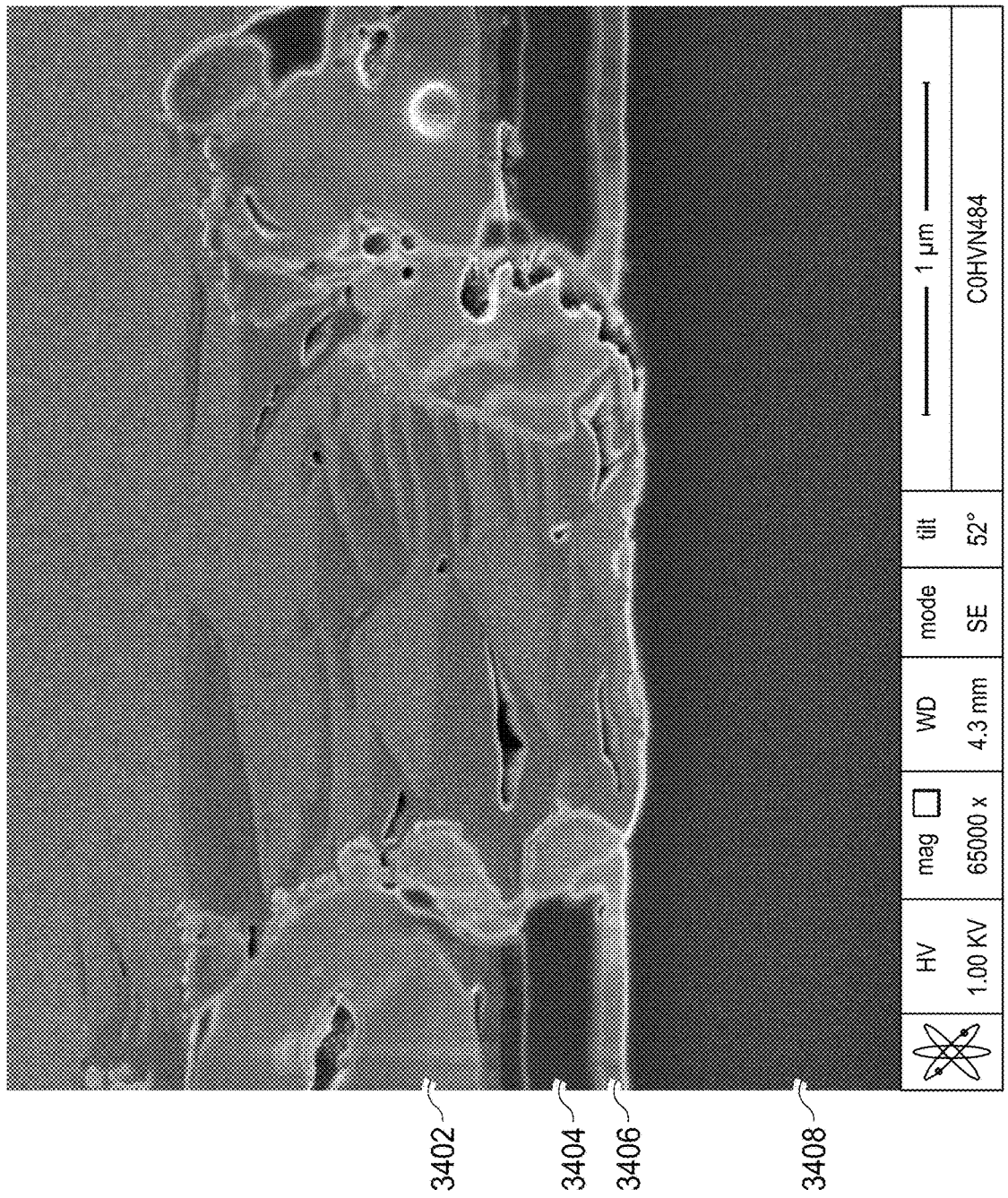
FIG. 34 shows a representation of a micrograph of a laser-weld according to an embodiment.

FIG. 34 shows an implemented weld 3408 between the top metal layer 3402, through the ILD dielectric layer 3404, and to the gate layer 3406, according to an embodiment.

Increasing the number of intersections improves the performance of the laser-weld.

The laser beam size is constrained to a size on the order of 500 μm×500 μm.

FIG. 35 is a schematic of a single pixel 3500 according to an embodiment including a Thin Film Transistor ("TFT") 3510 coupled to a photodiode 3508. The photodiode 3508 is biased via the VBIAS line 3506. The TFT 3510 is turned on and off via the Gate line 3502, and the data of the pixel is read out via the Data line 3504.

FIG. 36 is a schematic of an image sensor pixel array 3600 including a plurality of pixels 3500 of the type shown in FIG. 35, and also includes a bias generator 3602 for generating the bias voltages of the array, a gate driver 3604 for driving the TFT gates in the array, and readout electronics 3606, which receives the data from the array. Note that the bias generator 3602, the gate driver 3604, and the readout electronics 3606 are all located on the periphery of the array 3600.

FIG. 37 is an image sensor pixel array 3700 as shown in FIG. 36, but including an open circuit 3702 in the data line, resulting in data line portions 3504A and 3504B.

FIG. 38 is an image sensor pixel array 3800 as shown in FIG. 36, but including an open circuit 3802 in the gate line, resulting in gate line portions 3502A and 3502B. For the gate line open, the laser-weld is completed as previously described. The array is re-tested to ensure that the gate does not turn on (grounded or attached to a negative potential). This can be observed by a line of dark pixels as the gate line does not open. Then, the gate line is cut to isolate it from the gate driver 3604 in a manner similar to isolating the data line from the readout electronics.

FIG. 39 is an image sensor pixel array 3900 as shown in FIG. 36, but including a short circuit 3902 between a data line 3504 and a bias line 3506. A short-circuit is detected at the test image review step. The shorted lines (gate/bias, data/bias, or data/gate) are identified through the methodologies disclosed and described above, laser-welded, and cut to isolate, as was also described above.

In the particular case of a gate-to-bias short, the gate line 3502 is laser-welded to ground (or a negative potential) or the bias line 3506 is laser-welded to ground (or a negative potential). Both could be laser-welded to ground (or a negative potential, if desired). After confirmation of this weld (using a functional test image), the laser-welded line or lines are cut to isolate them from the corresponding peripheral electronics.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for improving the performance of an image sensor array comprising:
    performing at least one electrical test on the image sensor array;
    generating a test image from the at least one electrical test to detect an open circuit in a data line of the image sensor array;
    performing a laser-weld operation on at least one side of the data line to weld at least a portion of the data line to ground;
    re-testing the image sensor array to confirm a successful laser-weld operation;
    performing a laser-cut on a readout portion of the data line; and
    re-testing the image sensor array to confirm a successful laser-cut operation,
    wherein performing the laser-weld operation comprises using a laser to extend a via structure associated with the data line to a ground plane, wherein a laser profile of the laser comprises a double cross pattern, and wherein a plurality of laser pulses including the laser profile are applied to an upper surface of the via structure to ensure that the via structure successfully extends to the ground plane.

2. The method of claim 1, wherein performing at least one electrical test on the image sensor array comprises a sensor leakage test or a pixel sensitivity test.

3. The method of claim 1, wherein generating a test image comprises generating test images wherein data lines comprising an open circuit are imaged in a first color, and normal data lines are imaged in a second color.

4. The method of claim 1, wherein performing the laser-weld operation on both sides of the data line to weld first and second portions of the data line to ground.

5. The method of claim 1, wherein re-testing the image sensor array to confirm a successful laser-weld operation comprises generating a re-test image.

6. The method of claim 1, wherein performing the laser-cut on a readout portion of the data line ablates a section of the readout portion of the data line down to a glass substrate of the image sensor array.

7. The method of claim 1, wherein re-testing the image sensor array to confirm a successful laser-cut operation comprises electrically confirming that the data line is electrically isolated from peripheral readout electronics associated with the image sensor array.

8. A laser-weld method for improving the performance of an image sensor array comprising:
    identifying a data line in the array having an open circuit;
    identifying a weld-structure in electrical contact with one portion of the identified data line and electrically isolated from a bias plane;
    performing a laser-weld operation including energizing a top surface of the weld- structure with a plurality of pulses of a laser having a double cross pattern such that the weld-structure successfully extends to and is in electrical contact with the bias plane; and
    testing the image sensor array to confirm a successful laser-weld operation.

9. The laser-weld method of claim 8, further comprising energizing the top surface of the weld-structure with a UV laser.

10. The laser-weld method of claim 8, further comprising energizing the top surface of the weld-structure with a laser having a plurality of double cross patterns.

11. The laser-weld method of claim 10, wherein the plurality of double cross patterns are spaced apart by a distance of at least 5 μm.

12. The laser-weld method of claim 8, further comprising energizing the top surface of the weld-structure with an additional IR laser.

13. A method for improving the performance of an image sensor array comprising:
    performing at least one electrical test on the image sensor array;
    generating a test image from the at least one electrical test to detect an open circuit or a short circuit associated with a line in the image sensor array;
    performing a laser-weld operation on at least one side of the line to weld at least a portion of the line to a fixed voltage;
    re-testing the image sensor array to confirm a successful laser-weld operation; and
    laser cutting the line to isolate it from corresponding peripheral electronics,
    wherein performing the laser-weld operation comprises using a laser to extend a via structure associated with the line to a source of the fixed voltage, wherein a laser profile of the laser comprises a double cross pattern, and wherein a plurality of laser pulses including the laser profile are applied to an upper surface of the via structure to ensure that the via structure successfully extends to the source of the fixed voltage.

14. The method of claim 13, wherein the image sensor array comprises a glass substrate.

15. The method of claim 13, wherein performing the laser-weld operation comprises a applying a maximum laser beam size of 500 μm×500 μm.

16. The method of claim 13, wherein the line comprises a data line, a gate line, or a bias line.

17. The method of claim 1, wherein the plurality of laser pulses comprises between 50 and 100 laser pulses.

18. The method of claim 8, wherein the plurality of pulses comprises between 50 and 100 laser pulses.

19. The method of claim 13, wherein the plurality of laser pulses comprises between 50 and 100 laser pulses.

* * * * *